(12) United States Patent
Sugiyama et al.

(10) Patent No.: US 8,138,022 B2
(45) Date of Patent: Mar. 20, 2012

(54) METHOD OF MANUFACTURING SEMICONDUCTOR DEVICE

(75) Inventors: Michiaki Sugiyama, Kanagawa (JP); Takashi Miwa, Kanagawa (JP); Toshikazu Ishikawa, Kanagawa (JP); Tatsuya Hirai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 85 days.

(21) Appl. No.: 12/793,923

(22) Filed: Jun. 4, 2010

(65) Prior Publication Data
US 2010/0330742 A1 Dec. 30, 2010

(30) Foreign Application Priority Data
Jun. 26, 2009 (JP) .................... 2009-152259

(51) Int. Cl.
*H01L 21/00* (2006.01)

(52) U.S. Cl. ............... 438/109; 438/667; 257/E23.011

(58) Field of Classification Search ............ 438/109, 438/667; 257/686, 774, 7, E23.011, E23.174
See application file for complete search history.

(56) References Cited

U.S. PATENT DOCUMENTS

| | | | | |
|---|---|---|---|---|
| 7,504,283 | B2* | 3/2009 | Dunne | 438/107 |
| 7,843,059 | B2* | 11/2010 | Gomyo et al. | 257/723 |
| 2005/0184377 | A1* | 8/2005 | Takeuchi et al. | 257/686 |
| 2006/0231939 | A1* | 10/2006 | Kawabata et al. | 257/686 |
| 2007/0096287 | A1 | 5/2007 | Araki et al. | |
| 2008/0293236 | A1 | 11/2008 | Kobayashi | |

FOREIGN PATENT DOCUMENTS

| | | |
|---|---|---|
| JP | 2007-123454 A | 5/2007 |
| JP | 2008-288490 A | 11/2008 |
| JP | 2008-300498 A | 12/2008 |

* cited by examiner

*Primary Examiner* — Richard A. Booth
(74) *Attorney, Agent, or Firm* — Mattingly & Malur, PC

(57) ABSTRACT

A first conductive member made of metal is provided over a first wiring substrate, which is a mounting substrate in the lower tier, a through hole is provided in a second wiring substrate, which is a mounting substrate in the upper tier, at a position corresponding to the first conductive member in a plan view, and a wiring is exposed at the sidewall of the through hole. The first conductive member is inserted into the through hole on the corresponding first wiring substrate side and the first wiring substrate and the second wiring substrate are electrically coupled by filling the through hole with a second conductive member. an electrode pad that is electrically coupled to the second conductive member and over which a semiconductor member in the upper tier is mounted is formed on the main surface side of the second wiring substrate.

14 Claims, 32 Drawing Sheets

METHOD OF MANUFACTURING SEMICONDUCTOR DEVICE

CROSS-REFERENCE TO RELATED APPLICATION

The disclosure of Japanese Patent Application No. 2009-152259 filed on Jun. 26, 2009 including the specification, drawings and abstract is incorporated herein by reference in its entirety.

BACKGROUND OF THE INVENTION

The present invention relates to technology of manufacturing a semiconductor device, in particular, to the technology which is effective when applied to the manufacturing of a semiconductor device that mounts a plurality of semiconductor chips, chip parts, etc.

For the purposes of downsizing a mounting substrate (motherboard) that mounts semiconductor packages, chip parts (resistor, capacitor, inductor, etc.), etc., and of increasing the speed of a semiconductor system, an MCM (Multi Chip Module) type semiconductor device that mixedly mounts various kinds of semiconductor chip (microcomputer chip, memory chip, etc.) and chip parts in one semiconductor device is being developed.

As a configuration of such an MCM type semiconductor device, mention is made of, for example, that of a POP (Package On Package) type semiconductor device in which a plurality of wiring substrates over which semiconductor chips or chip parts are mounted is prepared and on one of the wiring substrates, the other wiring substrate is stacked, as shown in Japanese Patent Laid-Open No. 2007-123454 (Patent Document 1).

Further, as a configuration of another POP type semiconductor device, mention is made of, for example, that in which a wiring substrate (first substrate 10) in the lower tier is electrically coupled to a wiring substrate (second substrate 20) in the upper tier via a ball-shaped electrode and over the wiring substrate in the upper tier, another semiconductor package is mounted, as shown in FIG. 2(D) in Japanese Patent Laid-Open No. 2008-288490 (Patent Document 2).

Furthermore, as a configuration of another POP type semiconductor device, mention is made of, for example, that in which electrodes (bump 118) are formed in advance over a wiring substrate (first wiring layer 101) in the lower tier and a wiring substrate (second wiring layer 104) in the upper tier, respectively, and these wiring substrates are joined to each other, as shown in FIG. 10(h) in Japanese Patent Laid-Open No. 2008-300498 (Patent Document 3).

SUMMARY OF THE INVENTION

A POP type semiconductor device is expected to be a promising configuration of an MCM type semiconductor device because semiconductor packages selected in advance as non-defective products are prepared and these semiconductor packages are combined in accordance with required functions, and therefore, it is possible to enhance yield of a semiconductor device.

Because of this, the inventors of the present invention have first examined the configuration disclosed in the above-mentioned Patent Document 1 before manufacturing a POP type semiconductor device.

As a result of the examination, it has been found that in the configuration disclosed in the above-mentioned Patent Document 1, the semiconductor chips or chip parts are mounted over the wiring substrate disposed in the lower tier, and therefore, there are restrictions on the arrangement position of an external terminal that is formed over the wiring substrate to be disposed in the upper tier and used to be electrically coupled with the wiring substrate in the lower tier.

Because of the above, the inventors of the present invention have examined the configuration disclosed in the above-mentioned Patent Document 2.

In the configuration disclosed in the above-mentioned Patent Document 2, another wiring substrate (second substrate 20) is stacked over a wiring substrate (first substrate 10) in the lower tier and over the wiring substrate (second substrate 20), another semiconductor package (electronic part 52) is mounted, and therefore, it is not necessary to align the arrangement position of an external terminal of the semiconductor package (electronic part 52) to be stacked with the position of an electrode pad formed over the wiring substrate (first substrate 10) in the lower tier. That is, there are no restrictions on the arrangement position of the external terminal.

However, in the configuration disclosed in the above-mentioned Patent Document 2, the wiring substrate (first substrate 10) in the lower tier and the wiring substrate (second substrate 20) in the upper tier are electrically coupled via a ball-shaped electrode. Because of this, it is necessary to make the height (size) of the electrode greater than the mounting height of the semiconductor chip or chip part mounted over the wiring substrate in the lower tier. Due to this, the pitch between neighboring electrodes is also increased, and therefore, it becomes difficult to reduce the outer dimensions of the wiring substrate.

Because of the above, the inventors of the present invention have examined the configuration disclosed in the above-mentioned Patent Document 3.

In the configuration disclosed in the above-mentioned Patent Document 3, electrodes (bump 118) over which an Au plated film is formed are provided in advance over the wiring substrate (first wiring layer 101) in the lower tier and the wiring substrate (second wiring layer 104) in the upper tier, respectively, and these wiring substrates are joined to each other, and therefore, it is possible to reduce the size (width in the horizontal direction) of each electrode.

However, in the manufacturing method disclosed in the above-mentioned Patent Document 3, an adhesive layer in which a void (second void 135) is formed is prepared, the adhesive layer is disposed between the wiring substrates in the lower tier and the upper tier so that the electrode is located within the void, then these are heated and pressurized, and thereby the joint part of the respective electrodes is covered with the adhesive layer.

In recent years, however, accompanying the improvement in functions of a semiconductor device, the trend is toward the increasing number of electrodes to be electrically coupled to the semiconductor chip. Because of this, a high alignment precision is required when forming the voids corresponding to a plurality of electrodes in the adhesive layer and when arranging the electrodes in the voids, respectively. Further, the above-mentioned Patent Document 3 describes that it is not necessary to form a void corresponding to each electrode, however, in this case, the adhesive layer is interposed between the electrode in the lower tier and the electrode in the upper tier, and therefore, the resistance component generated in the conduction path between the semiconductor package in the lower tier and the semiconductor package in the upper tier becomes high. Due to this, it becomes difficult to cope with the high operating speed of the semiconductor device.

One object of the present invention is to provide a technique capable of improving the degree of freedom of semiconductor packages to be combined in an MCM type semiconductor device.

Another object of the present invention is to provide a technique capable of realizing reduction in size of an MCM type semiconductor device.

Another object of the present invention is to provide a technique capable of improving reliability of an MCM type semiconductor device.

Another object of the present invention is to provide a technique capable of realizing a high operating speed of an MCM type semiconductor device.

The above-mentioned and the other purposes and the new feature of the present invention will become clear from the description of the present specification and the accompanying drawings.

The following explains briefly the outline of a typical invention among the inventions disclosed in the present application.

A method of manufacturing a semiconductor device according to the present invention comprises the steps of: (a) preparing a first substrate having a first main surface, a first electrode pad formed over the first main surface, and a first back surface on the opposite side of the first main surface; and (b) disposing a second substrate having a second main surface, a second electrode pad formed over the second main surface, and a second back surface on the opposite side of the second main surface over the first substrate so that the second back surface of the second substrate faces the first main surface of the first substrate, wherein in the (b) step, a first conductive member which is formed over one of the first substrate and the second substrate and which has a height greater than the thickness of a semiconductor chip disposed between the first substrate and the second substrate is disposed within a through hole formed in the other of the first substrate and the second substrate, and the first conductive member is electrically coupled to a through-hole wiring formed within the through hole and electrically coupled to the first electrode pad or the second electrode pad.

The following explains briefly the effect acquired by the typical invention among the inventions disclosed in the present application.

(1) It is possible to improve the degree of freedom of semiconductor packages to be combined in an MCM type semiconductor device.

(2) It is possible to realize downsizing of an MCM type semiconductor device.

(3) It is possible to improve reliability of an MCM type semiconductor device.

DETAILED DESCRIPTION OF THE PREFERRED EMBODIMENTS

Figure 1:
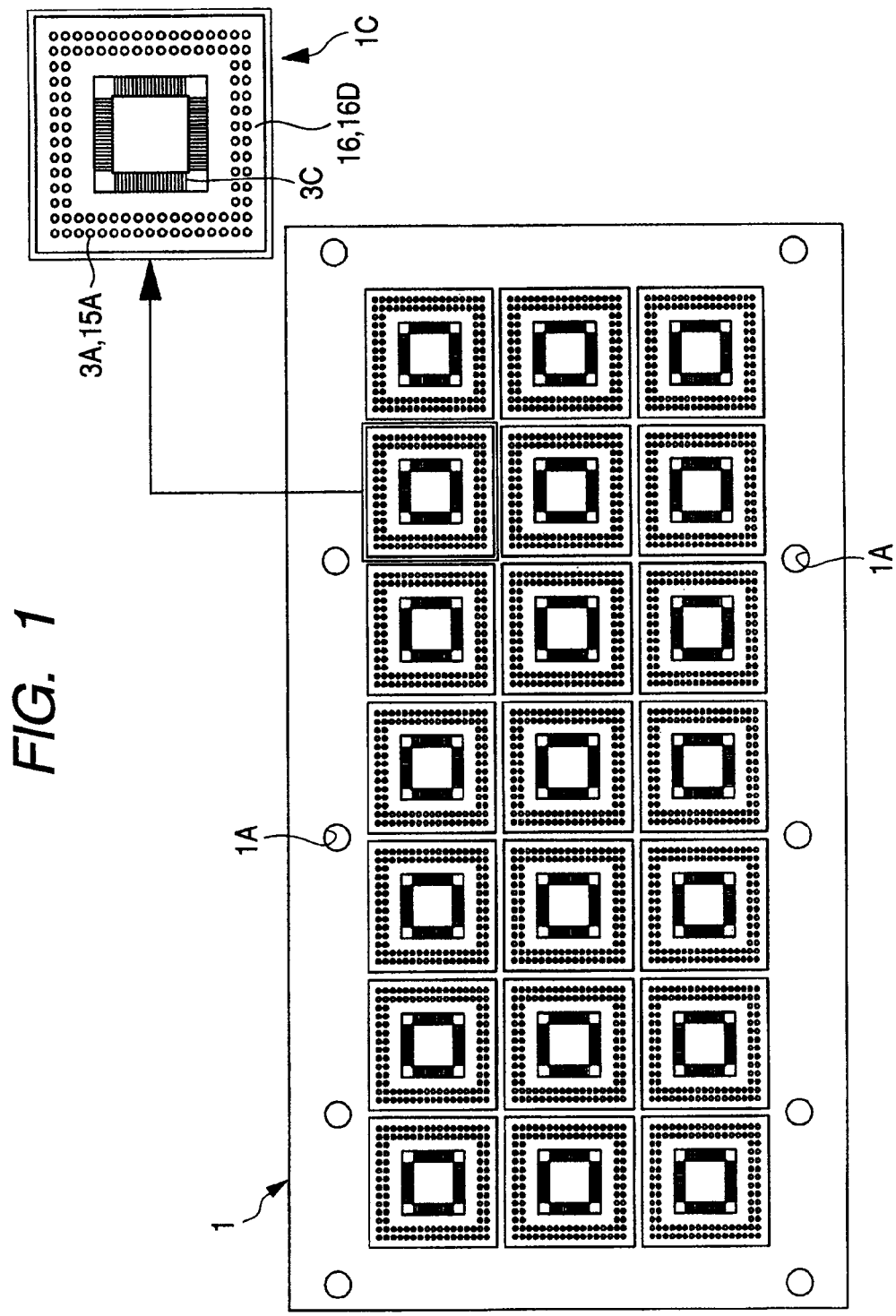
FIG. 1 is a plan view showing the main surface side of a substrate matrix to be a base substrate for forming a semiconductor device, which is an embodiment of the present invention.

[1] Description Form in the Present Application

Explanation of Basic Terms and Terms

The following embodiments will be explained, divided into plural sections or embodiments, if necessary for convenience. Except for the case where it shows clearly in particular, they are not mutually unrelated and one has relationships such as a modification, details, and supplementary explanation of some or entire of another.

In the following embodiments, when referring to the number of elements, etc. (including the number, a numeric value, an amount, a range, etc.), they may be not restricted to the specific number but may be greater or smaller than the specific number, except for the case where they are clearly specified in particular and where they are clearly restricted to a specific number theoretically.

Furthermore, in the following embodiments, it is needless to say that an element (including an element step etc.) is not necessarily indispensable, except for the case where it is clearly specified in particular and where it is considered to be clearly indispensable from a theoretical point of view, etc. In the embodiments etc., when elements etc. are referred to in, for example, wording "comprising A" or "including A", it is needless to say that other elements may be comprised or included except for the case where it is clearly specified to be the only element in particular.

Similarly, in the following embodiments, when shape, positional relationship, etc. of an element etc. is referred to, what resembles or is similar to the shape substantially shall be included, except for the case where it is clearly specified in particular and where it is considered to be clearly not right from a theoretical point of view. This statement also applies to the numeric value and range described above.

When a material etc. is referred to, the specified material is a main material except for the case where it is clearly specified to be not in particular and it is clearly not from the theoretical point of view or from the standpoint of circumstances, and secondary elements, added elements, attached elements, etc., may also be included. For example, a silicon member includes, except for the case where it is clearly specified in particular, added impurities, binary or ternary alloys (for example, SiGe), etc., including silicon as its main component are included, in addition to the pure silicon.

In all the drawings for explaining embodiments, the same symbol is attached to the same member, as a principle, and the repeated explanation thereof is omitted.

In the drawings used in embodiments, in order to make a drawing intelligible, hatching may be attached even if it is a plan view.

Embodiments of the present invention will be described below in detail based on the drawings.

[2] Description of Semiconductor Device

Figure 45:
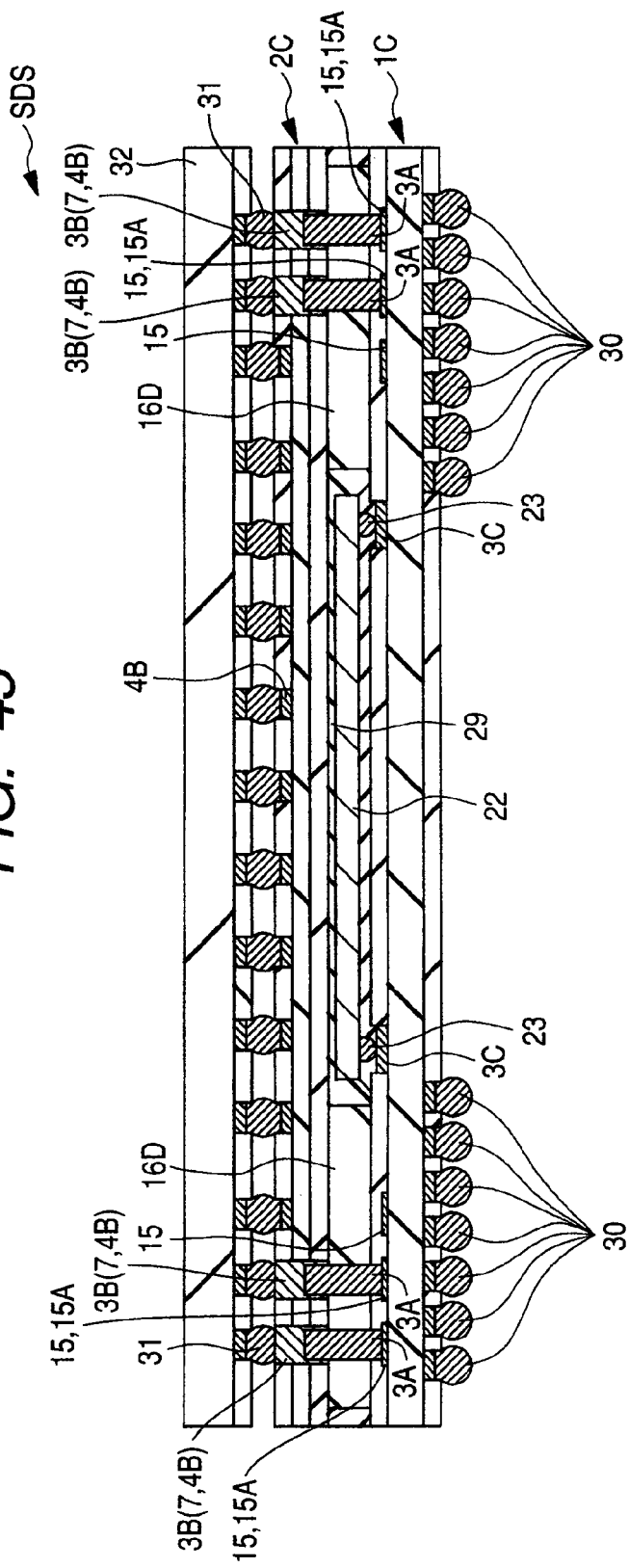
FIG. 45 is a section view of essential parts during the manufacturing process of the semiconductor device, following FIG. 43.
Figure 46:
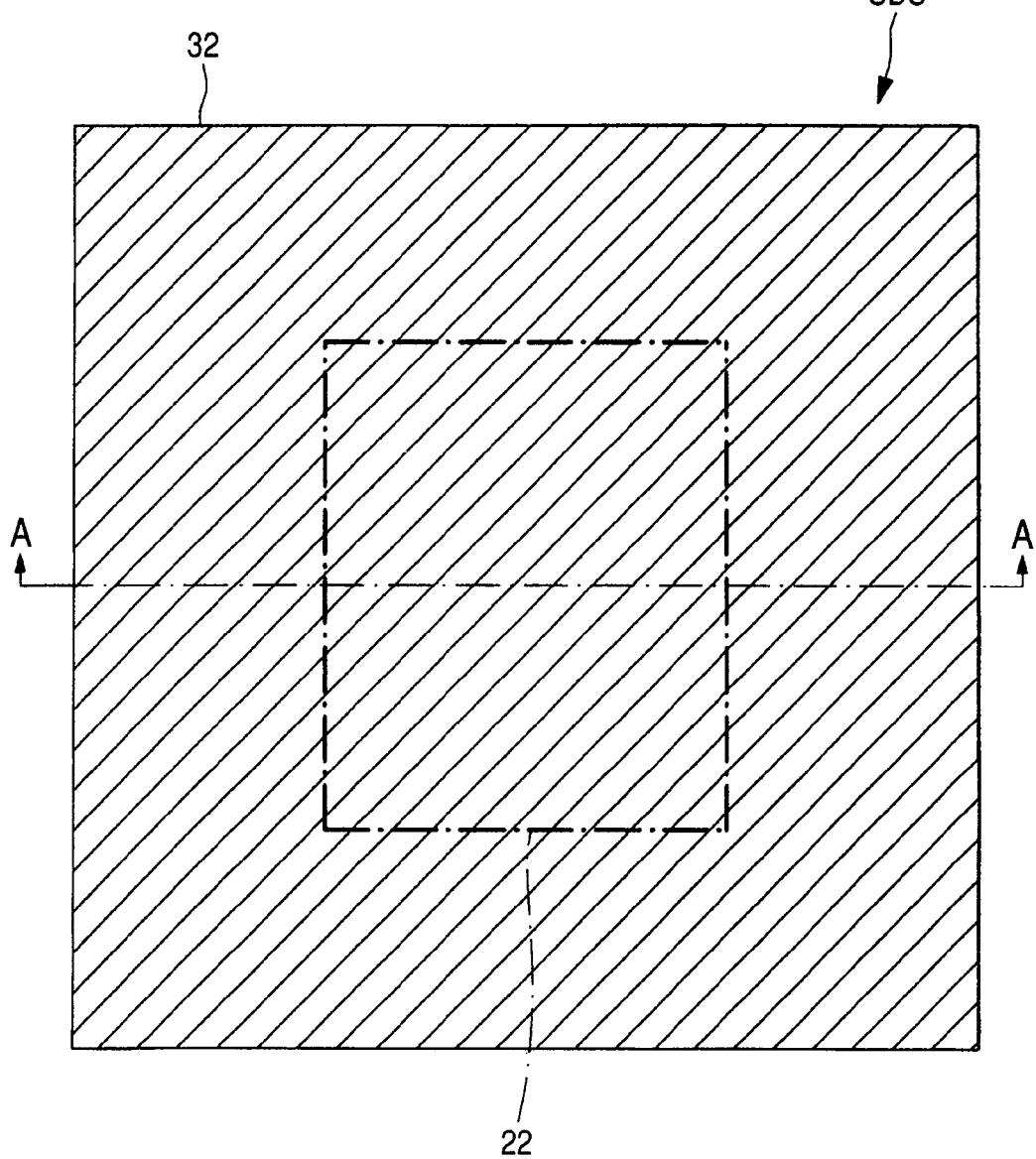
FIG. 46 is a plan view during the manufacturing process of the semiconductor device, following FIG. 44.

FIG. 46 is a plan view of the top surface side of a finished semiconductor device (semiconductor system) SDS and FIG. 45 is a section view along A-A line in FIG. 46.

A configuration of a semiconductor device in a typical embodiment of the present invention is such that a semiconductor chip (chip) 22 is mounted over a wiring substrate (base substrate, interposer) 1C to be a base as shown in FIG. 45. Over the wiring substrate 1C, an auxiliary wiring substrate (sub substrate, interposer) 2C is disposed so as to cover the semiconductor chip 22. The wiring substrate 2C located in the upper tier is electrically coupled to the wiring substrate 1C in the lower tier via a conductive member 3B filled in a through hole that penetrates through from the surface of the wiring substrate 2C to its back surface and a conductive member 3A formed in the top surface (main surface, surface) of the wiring substrate 1C. Between the wiring substrate 1C in the lower tier and the wiring substrate 2C in the upper tier, a mold resin (sealing body) 29 is formed so as to seal the semiconductor chip 22. On the undersurface (back surface, mounting surface) of the wiring substrate 1C in the lower tier, a plurality of bump electrodes 30 to be external terminals is formed. Further, over the wiring substrate 2C in the upper tier, semiconductor members 32, such as a semiconductor chip separately prepared, a semiconductor package in which a semiconductor chip is mounted, and a chip part, are mounted. Part of the mold resin (sealing body) 29 is also formed between the semiconductor chip 22 and the wiring substrate 2C in the upper tier. Because of this, even if the thickness of the wiring substrate 2C is reduced, it is possible to suppress a problem that the wiring substrate 2C distorts due to the load when the semiconductor member 32 is mounted. Further, by changing the kinds of the semiconductor member 32 to be mounted over the wiring substrate 2C, it is possible to construct various semiconductor systems.

[3] Description of Base Substrate

Next, details of the wiring substrate 1C in the present embodiment will be described.

Figure 2:
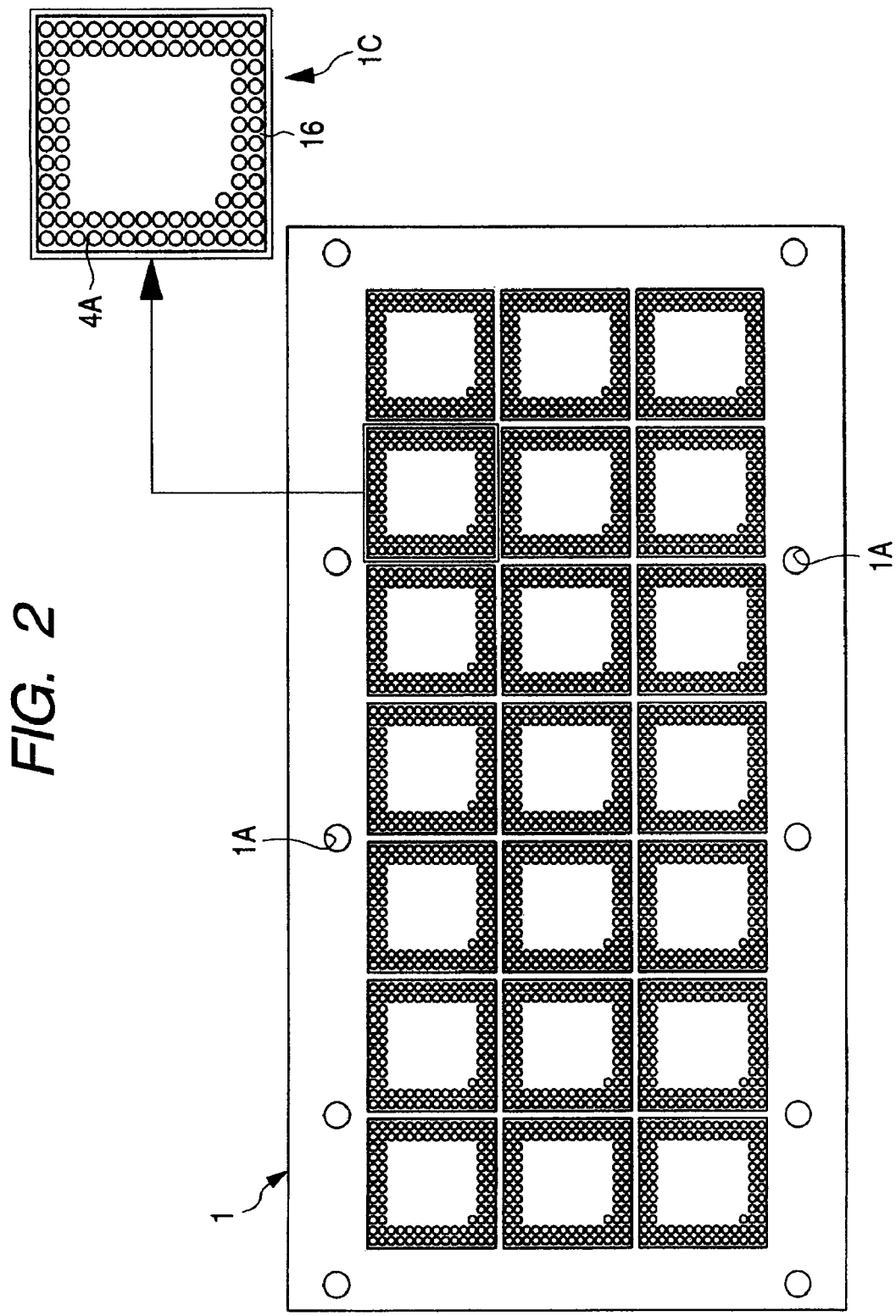
FIG. 2 is a plan view showing the back surface side of a substrate matrix to be a base substrate for forming a semiconductor device, which is an embodiment of the present invention.

FIG. 1 is a plan view of the top surface (main surface, surface) side of a substrate for multiple pieces over which a plurality of wiring substrates (package region) 1C to be a base is formed, and FIG. 2 is a plan view of the undersurface (back surface, mounting surface) side of the substrate for multiple pieces shown in FIG. 1.

Figure 32:
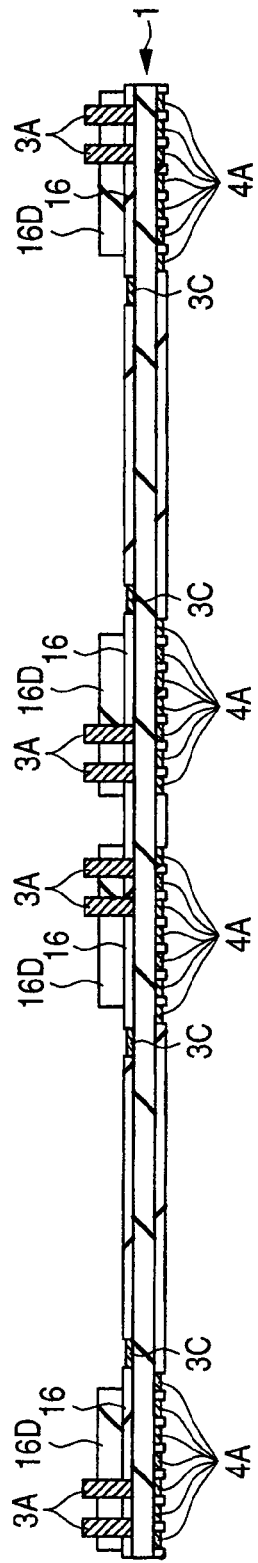
FIG. 32 is a section view of essential parts for explaining a method of manufacturing a semiconductor device, which is an embodiment of the present invention.
Figure 33:
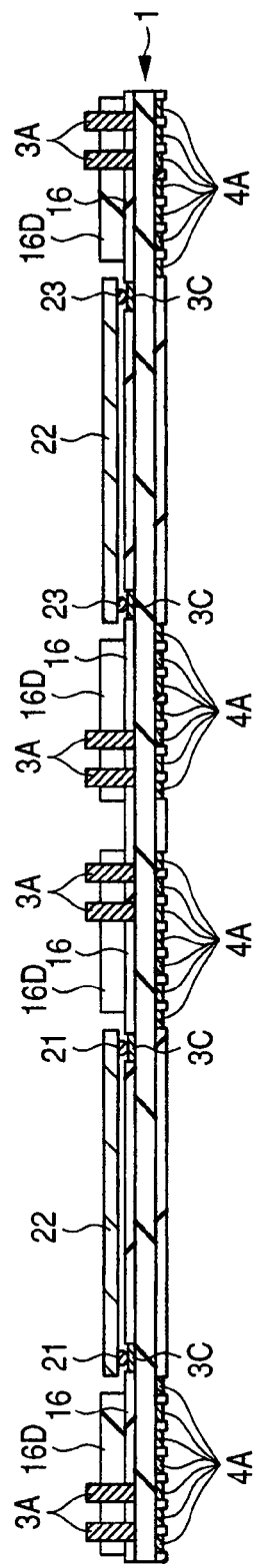
FIG. 33 is a section view of essential parts during a manufacturing process of the semiconductor device, following FIG. 32.
Figure 43:
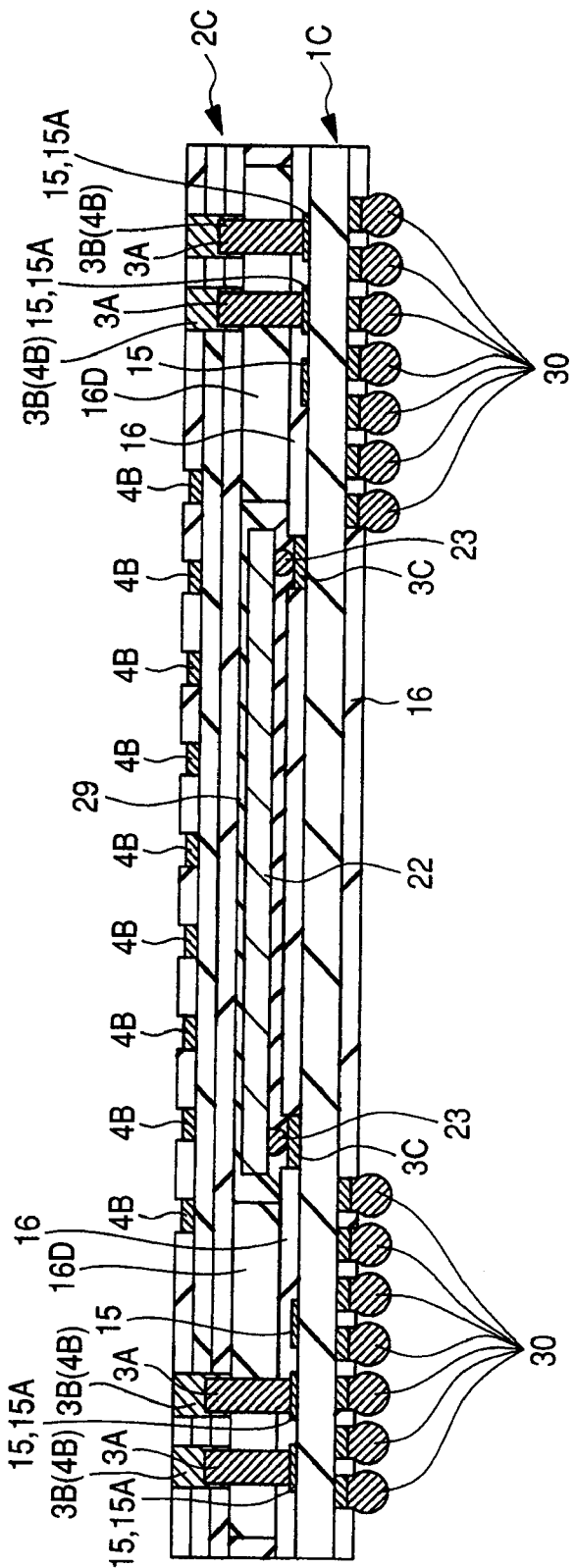
FIG. 43 is a section view of essential parts during a manufacturing process of a semiconductor device, which is an embodiment of the present invention.

The planar shape of one wiring substrate 1C to be a base is square as shown in FIG. 1, rectangular in the present embodiment. The material of the wiring substrate 1C includes a so-called glass/epoxy resin, which is glass fiber immersed with resin. As shown in FIG. 1, in the center part of the top surface (surface) of the wiring substrate 1C, an electrode pad (bonding lead) 3C to be electrically coupled to a semiconductor chip to be mounted later is formed. A plurality of the electrode pads 3C is formed along each side of the wiring substrate 1C. Around the electrode pads 3C, in other words, at the portion closer to the periphery side of the wiring substrate 1C than the electrode pad 3C, a plurality of electrode pads (land) 15A is formed as shown in FIG. 43. The electrode pads 15A are formed along each side of the wiring substrate 1C in a plurality of columns and are electrically coupled to the electrode pads 3C, respectively, as shown in the system block diagram in FIG. 48. In the top surface of the wiring substrate 1C, a solder resist (insulating film, insulating film for main surface) 16 (also refer to FIG. 29) is formed so as to expose part (surface) of the electrode pads 15A, 3C, respectively. In the surface of the electrode pad 15A that is exposed from the solder resist 16, the conductive member 3A is formed as shown in FIG. 32. In the present embodiment, the conductive member 3A is formed into the form of a post (cylindrical form) and includes, for example, copper (Cu). Further, over the solder resist 16, a solder resist (insulating film, insulating film for reinforcement) 16D is formed additionally so as to expose part (tip part) of the conductive member 3A and to cover the side surface of the conductive member 3A. This is because the height of the conductive member 3A formed over the electrode pad 15A is greater than the mounting height of the semiconductor chip mounted in a chip mounting region located inside the electrode pads 15A in the top surface of the wiring substrate 1C. However, the diameter of the conductive member 3A corresponds to the area that is exposed from an opening of the solder resist 16 in the electrode pad 15A, and therefore, the shape of the conductive member 3A is an elongated cylinder. Because of this, in the present embodiment, part of the conductive member 3A is supported by the solder resist 16D. Due to this, it is possible to reinforce the conductive member 3A.

On the other hand, in the undersurface (mounting surface) of the wiring substrate 1C, a plurality of electrode pads (land) 4A is formed as shown in FIG. 2. The electrode pads 4A are formed along each side of the wiring substrate 1C in a plurality of columns and are electrically coupled to the electrode pads 3C, respectively, as shown in the system block diagram in FIG. 48. Further, in the undersurface of the wiring substrate 1C, the solder resist (insulating film, insulating film for back surface) 16 is formed so as to expose part (surface) of the electrode pad 4A.

Although not shown schematically, the wiring substrate 1C has a plurality of wiring layers and includes four layers in the present embodiment. Each of the electrode pad (bonding lead) 3C and the electrode pad (land) 15A is formed by part of a wiring (wiring pattern) formed in a wiring layer in a first wiring layer (uppermost layer) and the electrode pad (land) 4A is formed by part of a wiring (wiring pattern) formed in a fourth wiring layer (lowermost layer).

[4] Explanation of Sub Substrate

Next, details of the wiring substrate 2C in the present embodiment will be described.

Figure 3:
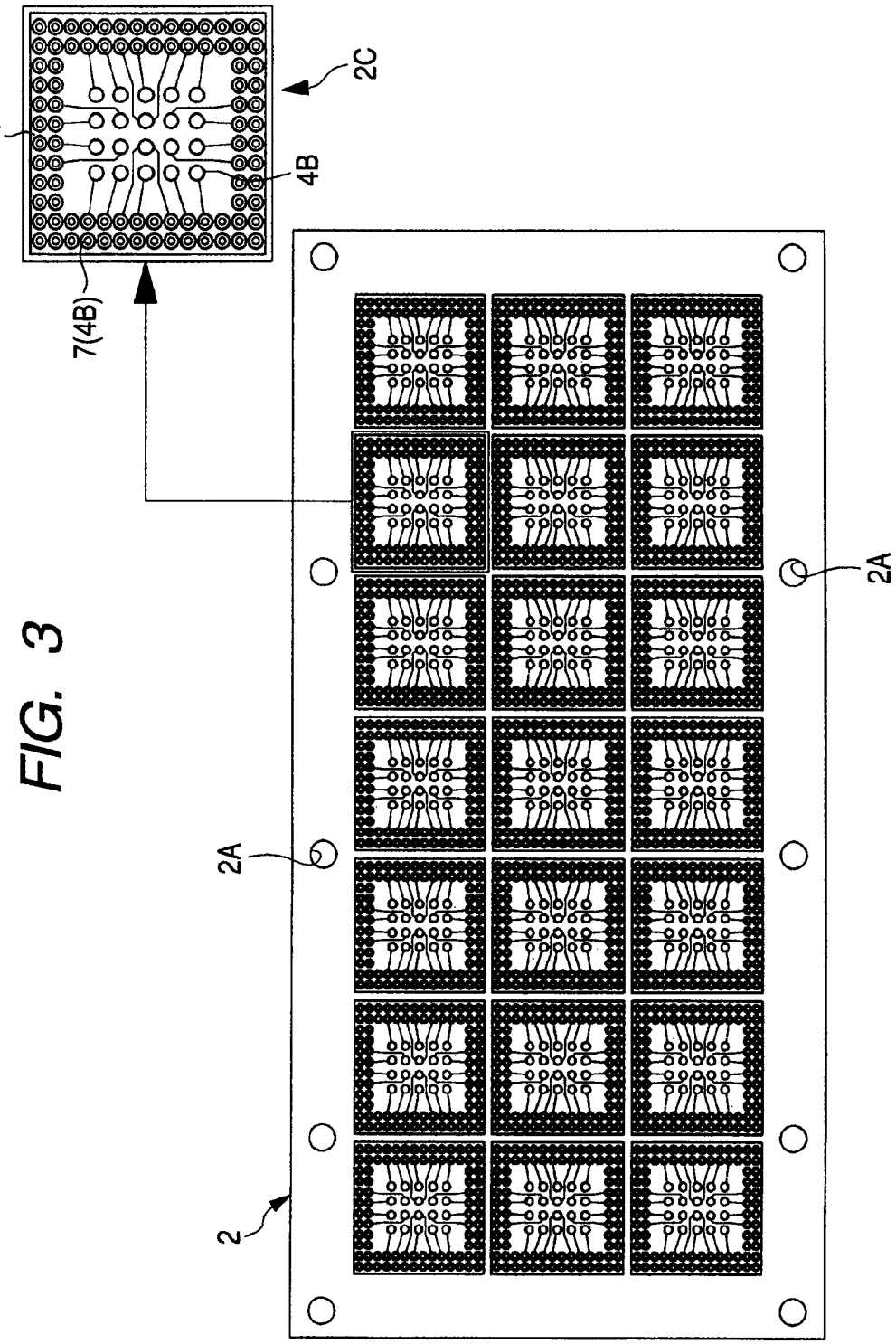
FIG. 3 is a plan view showing the main surface side of a substrate matrix to be a sub substrate for forming a semiconductor device, which is an embodiment of the present invention.
Figure 4:
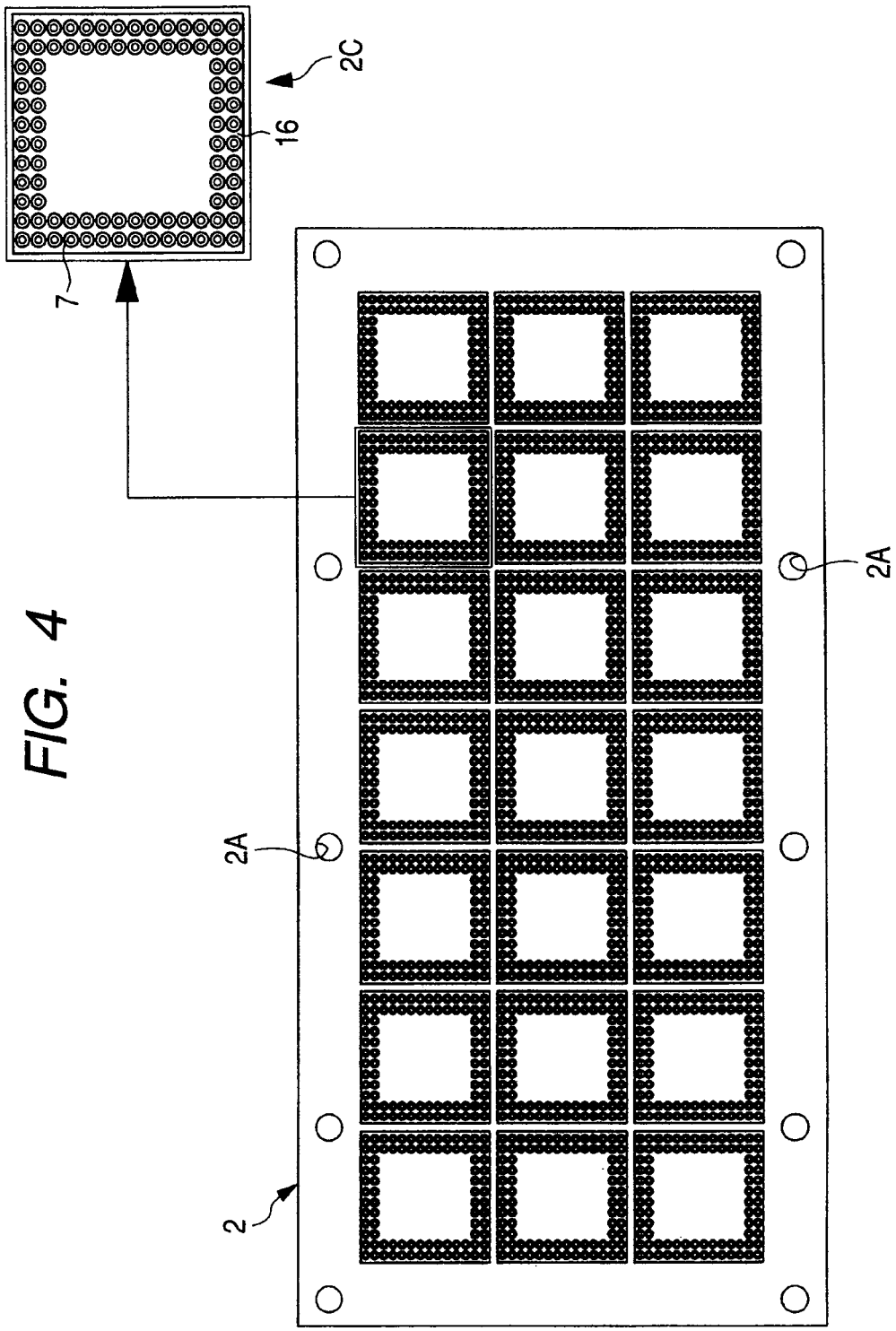
FIG. 4 is a plan view showing the back surface side of a substrate matrix to be a sub substrate for forming a semiconductor device, which is an embodiment of the present invention.

FIG. 3 is a plan view of the top surface (main surface, surface) side of a substrate for multiple pieces in which a plurality of wiring substrates (package region) 2C to be a sub substrate is formed, and FIG. 4 is a plan view of the undersurface (back surface, mounting surface) side of the substrate for multiple pieces shown in FIG. 3.

The planar shape of one wiring substrate 2C is square as shown in FIG. 3, rectangular in the present embodiment. The material of the wiring substrate 2C includes a so-called glass/epoxy resin, which is glass fiber immersed with resin. In the top surface (surface) of the wiring substrate 2C, a plurality of electrode pads (land, bonding lead) 4B is formed. As shown in FIG. 43, the electrode pad 4B is also formed in a region where the electrode pad 4B overlaps the semiconductor chip 22 to be mounted later over the wiring substrate 1C in the lower tier in a planar view. Further, in the top surface of the wiring substrate 2C, the solder resist (insulating film, insulating film for main surface) 16 is formed so as to expose part (surface) of the electrode pad 4B. Because of this, in a subsequent step, by disposing the auxiliary wiring substrate 2C over the wiring substrate 1C to be a base over which the semiconductor chip 22 is mounted, it is made possible to mount a semiconductor member (semiconductor chip, semiconductor package, or chip part) that is different in outer size from the wiring substrate 1C to be a base or a semiconductor member having an external terminal formed in a region overlapping the semiconductor chip 22 in a planar view.

Figure 29:
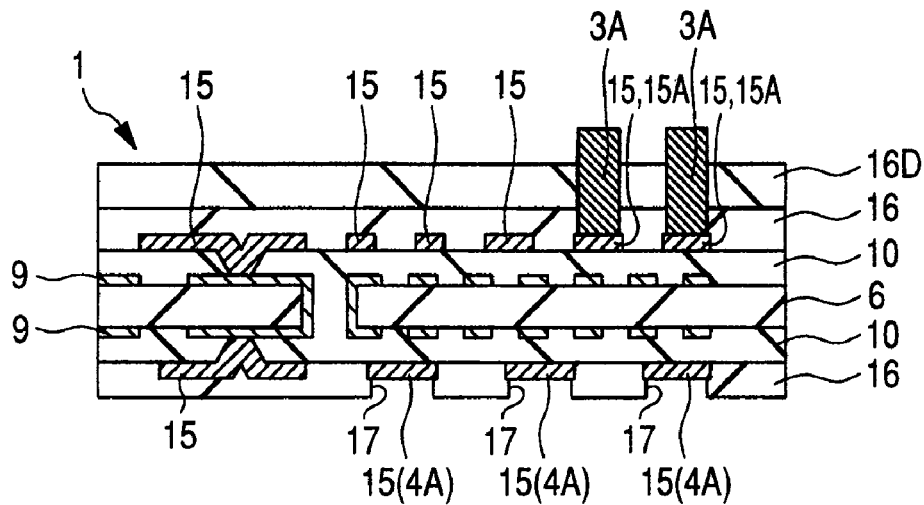
FIG. 29 is a section view of essential parts during the manufacturing process of the substrate matrix, following FIG. 28.

In the undersurface of the wiring substrate 2C, the solder resist (insulating film, insulating film for back surface) 16 is formed (also refer to FIG. 29).

Figure 39:
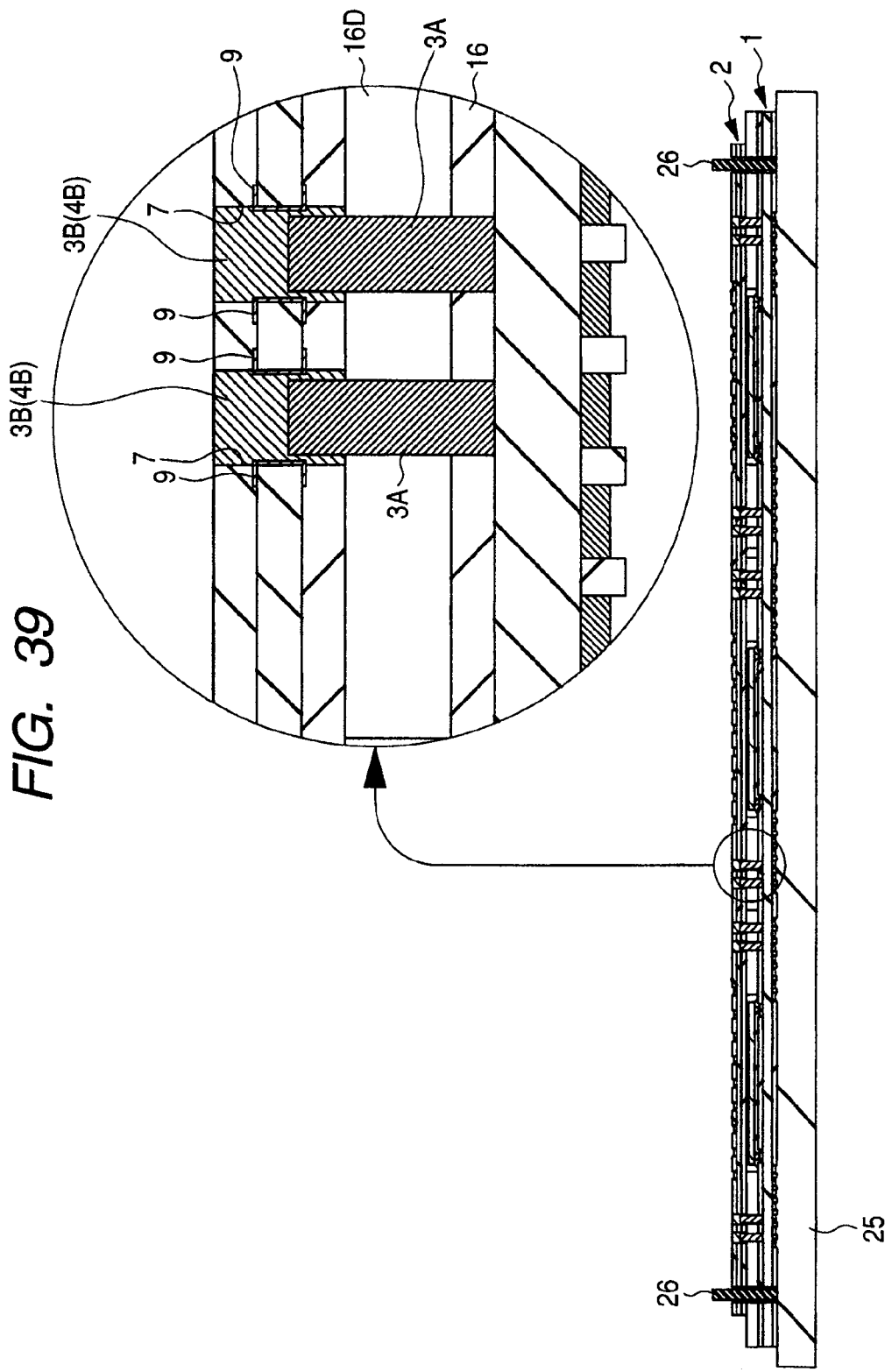
FIG. 39 is a section view of essential parts during the manufacturing process of the semiconductor device, following FIG. 38.

Although not shown schematically, the wiring substrate 2C has a plurality of wiring layers and includes two layers in the present embodiment. The electrode pad (land) 4B includes part of the wiring (wiring pattern) formed in the first wiring layer (uppermost layer). In the wiring substrate 2C, a through hole 7 that penetrates through from the surface to the back surface thereof is formed and at the sidewall of the through hole 7, a wiring 9 formed in the second wiring layer (lowermost layer) is exposed (refer to FIG. 31). Although details will be described later, when the conductive member 3A formed in the wiring substrate 1C, which is the base substrate previously described, is inserted into the through hole 7 formed in the wiring substrate 2C and the through hole 7 is filled with the conductive member 3B, the conductive member 3A is electrically coupled to the wiring 9 that is exposed at the sidewall of the through hole 7 via the conductive member 3B. Due to this, the wiring substrate 1C and the wiring substrate 2C are electrically coupled. The electrode pad 4B formed at a position overlapping, in a planar view, the conductive member 3A formed in the wiring substrate 1C, which is the base substrate, is formed when the inside of the through hole 7 is filled with the conductive member 3B as shown in FIG. 39 and FIG. 43. At this time, in the present embodiment, the inside of the through hole 7 is filled with the conductive member 3B so that the conductive member 3B has the same height as the top surface of the wiring substrate 2C, which is the sub substrate, or projects from the top surface. Due to this, the top part of the conductive member 3A can also be used as an electrode pad, and therefore, it is possible to extend the versatility of the semiconductor member that can be mounted in the wiring substrate 2C.

Figure 48:
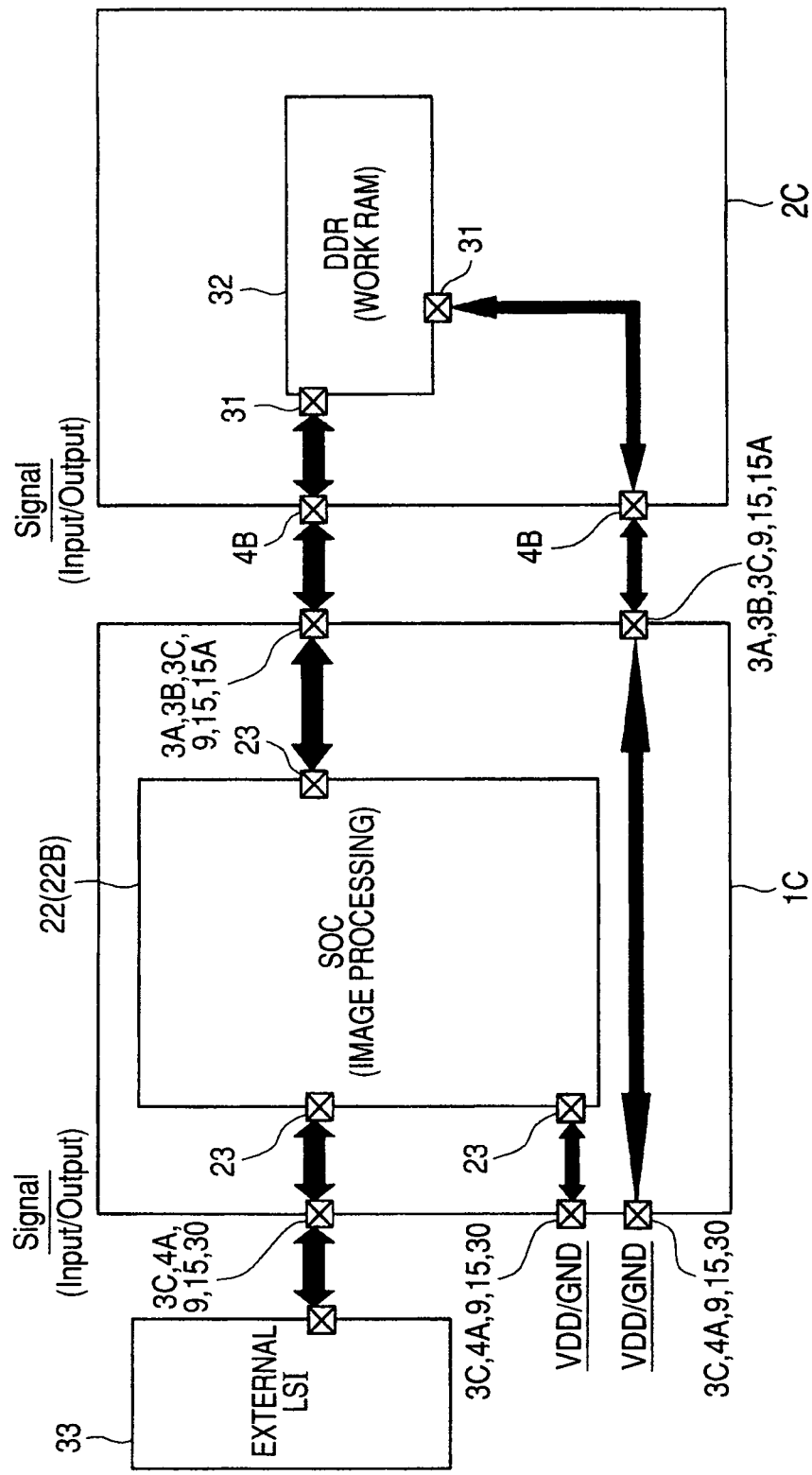
FIG. 48 is a system block diagram when mounting a semiconductor device, which is an embodiment of the present invention, over an external mounting substrate.

Here, as shown in the system block diagram in FIG. 48, in the present embodiment, the semiconductor chip 22 mounted over the wiring substrate 1C controls the semiconductor member 32 to be mounted over the wiring substrate 2C based on a signal from an external LSI 33. Further, a power source potential and a reference potential required to operate the semiconductor member 32 are also supplied to the semiconductor member 32 from the external LSI 33 via the wiring substrate 1C. Because of this, in the present embodiment, the wiring substrate 1C having the number of wiring layers greater than that of the wiring substrate 2C is used.

[5] Explanation of Semiconductor Chip

Next, details of the semiconductor chip 22 mounted over the wiring substrate 1C will be described.

Figure 52:
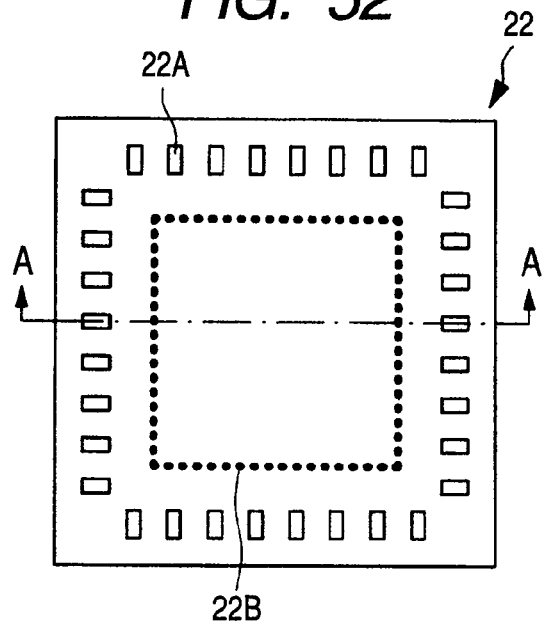
FIG. 52 is a plan view of the top surface side of a semiconductor chip included in a semiconductor device, which is an embodiment of the present invention.
Figure 53:
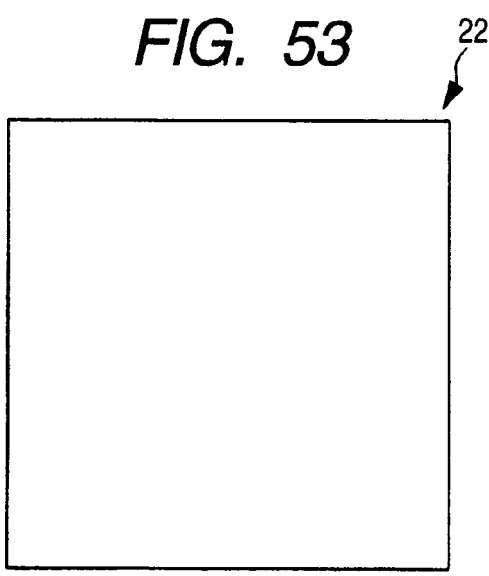
FIG. 53 is a plan view of the undersurface side of a semiconductor chip included in a semiconductor device, which is an embodiment of the present invention.
Figure 54:
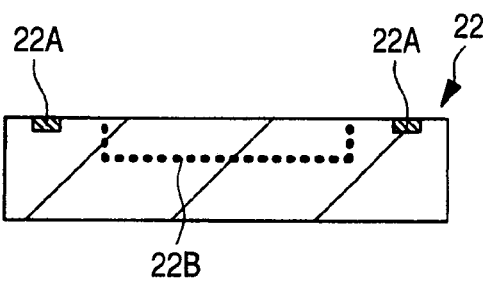
FIG. 54 is a section view along A-A line in FIG. 52.

FIG. 52 is a plan view of the top surface (surface, main surface) side of the semiconductor chip 22 to be mounted over the wiring substrate 1C, FIG. 53 is a plan view of the undersurface (back surface) side on the opposite side of the top surface shown in FIG. 52, and FIG. 54 is a section view along A-A line in FIG. 52.

The planar shape of the semiconductor chip 22 is square as shown in FIG. 52, and rectangular in the present embodiment. The material of the semiconductor chip 22 includes, for example, silicon (Si). In the top surface (main surface) of the semiconductor chip 22, a plurality of electrode pads 22A is formed along each side of the semiconductor chip 22. In the center part of the semiconductor chip 22, a circuit element (semiconductor element) 22B is formed and although not shown schematically, the electrode pads 22A formed around the circuit element 22B are electrically coupled to the circuit element 22B via wirings formed within the semiconductor chip 22. Further, the circuit element is formed on the top surface side of the semiconductor chip 22 as shown in FIG. 54. Then, the semiconductor chip 22 in the present embodiment is, for example, a controller system semiconductor chip and the circuit element 22B has, as shown in FIG. 48, an external interface for inputting/outputting a signal between the circuit element 22B and the external LSI 33 provided outside the finished semiconductor device (semiconductor system) SDS, and an internal interface for inputting/outputting a signal between the circuit element 22B and the semiconductor member 32 provided inside the semiconductor device.

On the other hand, the planar shape of the undersurface (back surface) on the opposite side of the top surface of the semiconductor chip 22 is square as shown in FIG. 53, and rectangular in the present embodiment, similar to that of the top surface side.

[6] Explanation of Method of Manufacturing Semiconductor Device (Semiconductor System) SDS Next, a method of manufacturing the semiconductor device (semiconductor system) SDS in the present embodiment will be described below. As described above, the semiconductor device in the present embodiment is a POP (Package On Package) type semiconductor device, which is one kind of MCM type. FIG. 1 to FIG. 4 are each a plan view of a wiring substrate used in manufacture of the POP type semiconductor device, wherein FIG. 1 and FIG. 2 are plan views of the main surface side and the back surface side of a substrate matrix 1 to be the wiring substrate IC in the lower tier, respectively, and FIG. 3 and FIG. 4 are plan views of the main surface side and the back surface side of a substrate matrix 2 to be the wiring substrate 2C in the upper tier stacked over the wiring substrate 1C, respectively. In FIG. 1 to FIG. 4, the main surface side or the back surface side in a region to be one wiring substrate IC or wiring substrate 2C is shown in an enlarged view.

The substrate matrixes 1, 2 shown in FIG. 1 to FIG. 4 are a substrate matrix of MAP (Mold Array Package) system and the structure is such that a plurality of regions to be the wiring substrate 1C or wiring substrate 2C is arranged in an array and a plurality of the wiring substrates 1C or wiring substrates 2C can be obtained from one substrate matrix 1 or 2. The substrate matrixes 1, 2 are provided with a plurality of guide holes 1A and a plurality of guide holes 2A, respectively, and although their details are to be described later, the main surface of the substrate matrix 1 and the back surface of the substrate matrix 2 are made to oppose each other and a guide is made to run so as to penetrate through the corresponding guide hole 1A and the guide hole 2A, and thereby, a state is brought about where the regions to be the wiring substrate 1C and the regions to be the wiring substrate 2C are opposed each other in a corresponding manner.

On the main surface side of the substrate matrix 1 (region to be each wiring substrate 1C), a plurality of the metal conductive members 3A is formed. The conductive members 3A are arranged at positions where they correspond to the through holes 7 (electrode pad 4B) formed so as to penetrate through the substrate matrix 2 (region to be each wiring substrate 2C) in a one-to-one manner when the region to be the wiring substrate 1C and the corresponding region to be the wiring substrate 2C are overlapped. By electrically coupling the conductive members 3A to the corresponding through holes 7 (electrode pad 4B), respectively, the wiring substrate 1C and the wiring substrate 2C are electrically coupled as a result, however, their details will be described at the same time when a manufacturing process of the semiconductor device in the present embodiment is described. On the main surface side of the substrate matrix 1, the electrode pad (bonding lead) 3C used to mount a semiconductor chip is formed.

In the back surface of the substrate matrix 1, the electrode pad 4A used to electrically couple the semiconductor device in the present embodiment to outside is formed and in the main surface of the substrate matrix 2, the electrode pad 4B used to mount a semiconductor chip or a chip part is formed. In the substrate matrixes 1, 2, a wiring layer is formed for each region to be the wiring substrate 1C and for each region to be the wiring substrate 2C, and by the wiring layer, the conductive member 3A and the electrode pad 4A are electrically coupled and the conductive member 3B and the electrode pad 4B are electrically coupled.

Next, a manufacturing process of the above-mentioned substrate base 1 will be described using FIG. 5 to FIG. 31. FIG. 5 to FIG. 31 each shows a section of essential parts during the manufacturing process of the substrate matrix 1.

Figure 5:
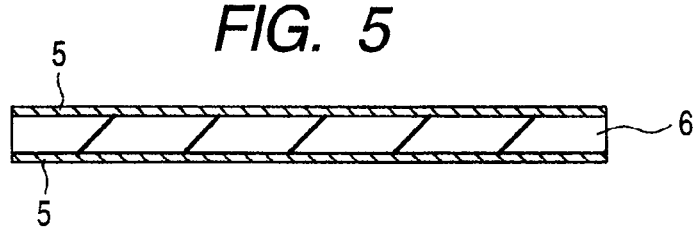
FIG. 5 is a section view of essential parts for explaining a method of manufacturing the substrate matrix shown in FIG. 1 and FIG. 2.

First, an insulating core material 6 is prepared, which has a thin copper film 5 formed on both surfaces, that is, in the main surface and in the back surface (refer to FIG. 5). As the material thereof, mention is made of, for example, a glass/epoxy resin, a BT resin, and an aramid non-woven fabric material.

Figure 6:
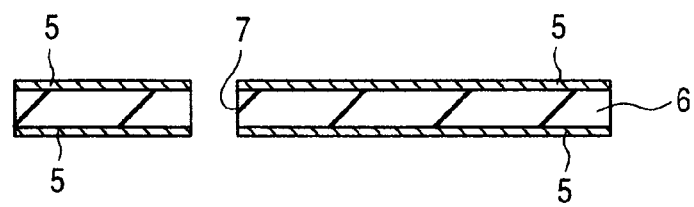
FIG. 6 is a section view of essential parts during a manufacturing process of the substrate matrix, following FIG. 5.
Figure 7:
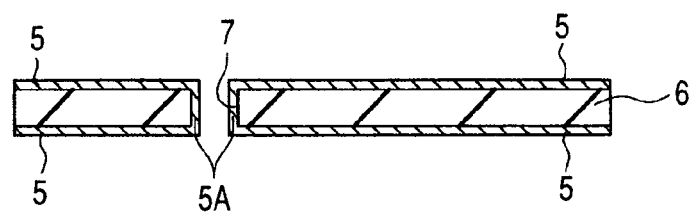
FIG. 7 is a section view of essential parts during the manufacturing process of the substrate matrix, following FIG. 6.
Figure 8:
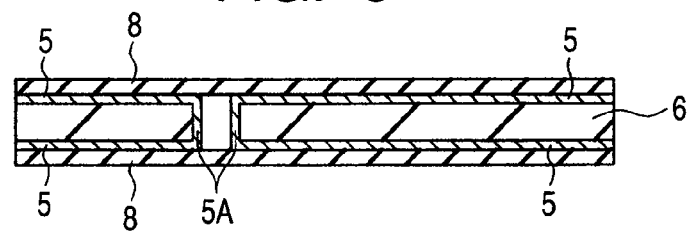
FIG. 8 is a section view of essential parts during the manufacturing process of the substrate matrix, following FIG. 7.
Figure 9:
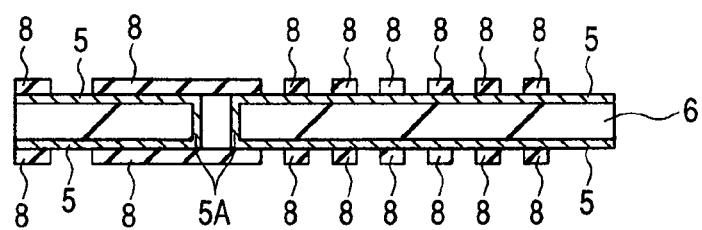
FIG. 9 is a section view of essential parts during the manufacturing process of the substrate matrix, following FIG. 8.
Figure 10:
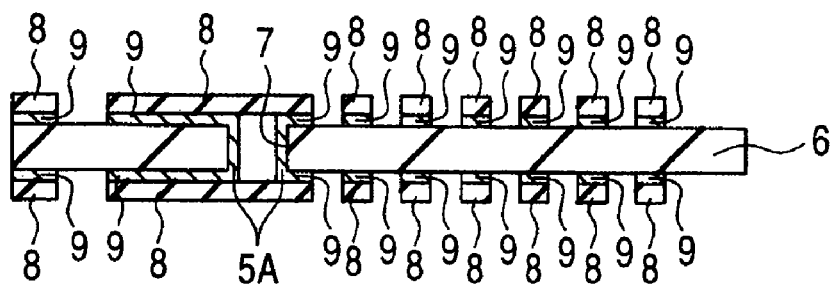
FIG. 10 is a section view of essential parts during the manufacturing process of the substrate matrix, following FIG. 9.
Figure 11:
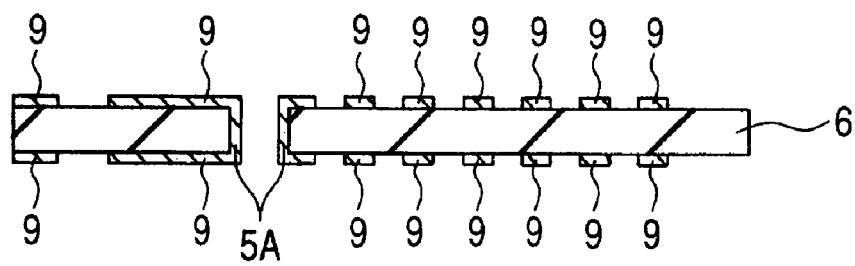
FIG. 11 is a section view of essential parts during the manufacturing process of the substrate matrix, following FIG. 10.
Figure 12:
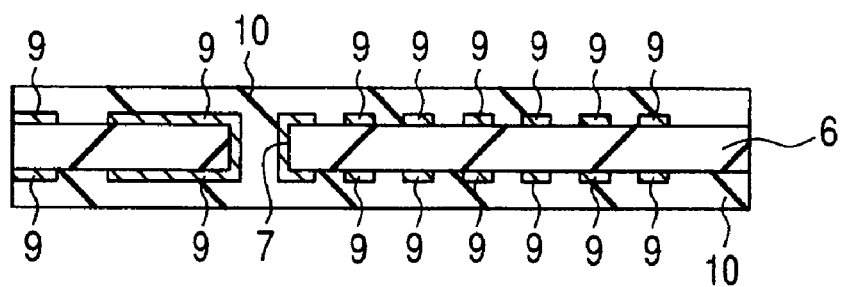
FIG. 12 is a section view of essential parts during the manufacturing process of the substrate matrix, following FIG. 11.

Following the above, the through hole 7 that penetrates through the main surface and the back surface of the core material 6 is formed using a drill or by laser processing (refer to FIG. 6). Next, by the plating method, a copper film 5A is formed on the wall surface of the through hole 7 and the thin copper film 5 on the main surface side and the thin copper film 5 on the back surface side are electrically coupled using the copper film 5A within the through hole 7 (refer to FIG. 7). Next, after pasting a photoresist film 8 including dry film onto both the main surface and the back surface of the core material 6 (refer to FIG. 8), the photoresist film 8 is patterned by the photolithography technique (refer to FIG. 9). Next, the thin copper film 5 is patterned by etching the thin copper film 5 on both surfaces of the core material 6 using the remained photoresist film 8 as a mask. By the process up to this step, it is possible to form the first wiring layer including the wiring 9 on both surfaces of the core material 6 (refer to FIG. 10). It is also possible to have a structure in which the wiring layers on both surfaces of the core material 6 are electrically coupled via the copper film 5A within the through hole 7.

Next, after peeling off the photoresist film 8 (refer to FIG. 11), an insulating layer 10 is deposited on both surfaces of the core material 6. Then, the through hole 7 is filled with the insulating layer 10 (refer to FIG. 12). As the material of the insulating layer 10, mention is made of, for example, a glass/epoxy resin, a BT resin, and an aramid non-woven fabric material like the core material 6.

Figure 13:
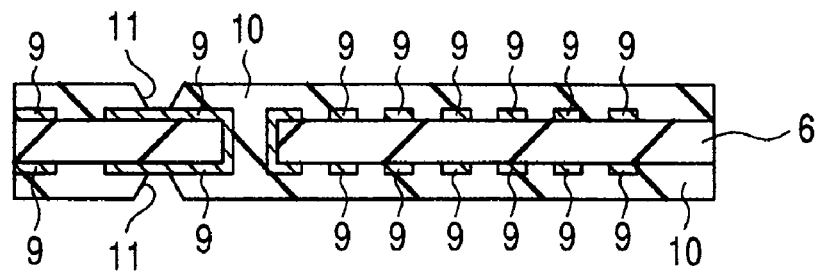
FIG. 13 is a section view of essential parts during the manufacturing process of the substrate matrix, following FIG. 12.
Figure 14:
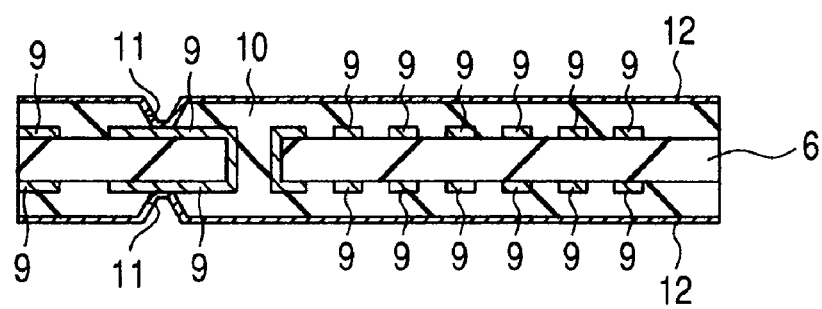
FIG. 14 is a section view of essential parts during the manufacturing process of the substrate matrix, following FIG. 13.
Figure 15:
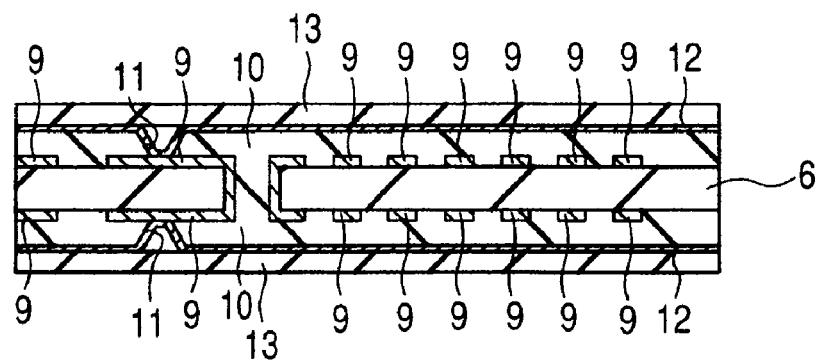
FIG. 15 is a section view of essential parts during the manufacturing process of the substrate matrix, following FIG. 14.
Figure 16:
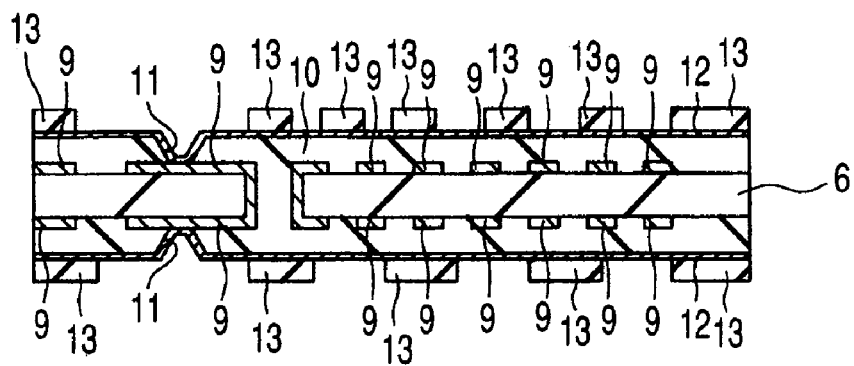
FIG. 16 is a section view of essential parts during the manufacturing process of the substrate matrix, following FIG. 15.
Figure 17:
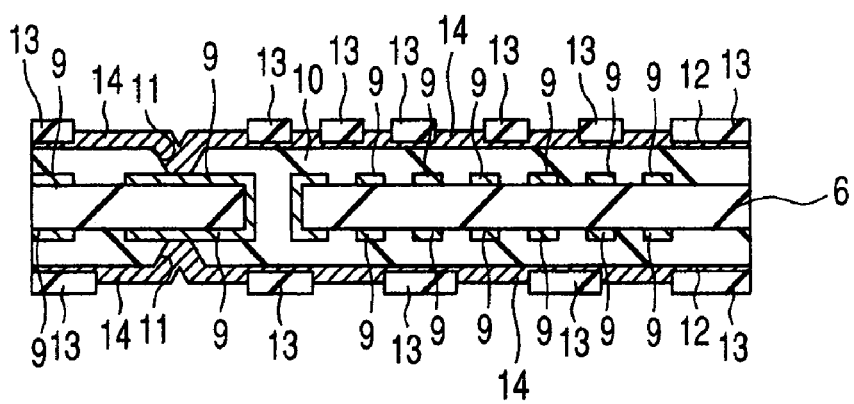
FIG. 17 is a section view of essential parts during the manufacturing process of the substrate matrix, following FIG. 16.
Figure 18:
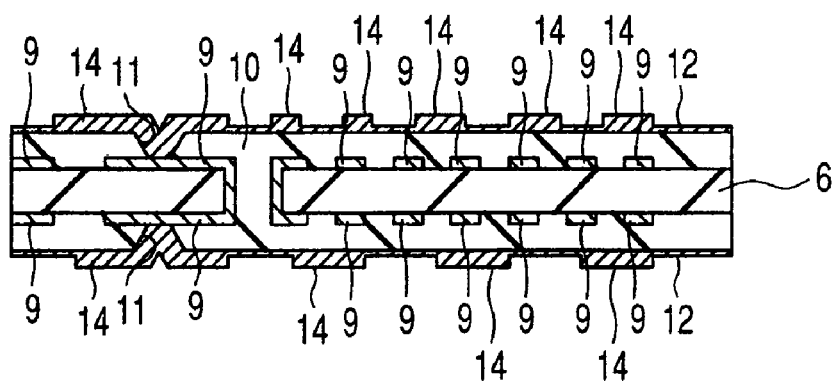
FIG. 18 is a section view of essential parts during the manufacturing process of the substrate matrix, following FIG. 17.
Figure 19:
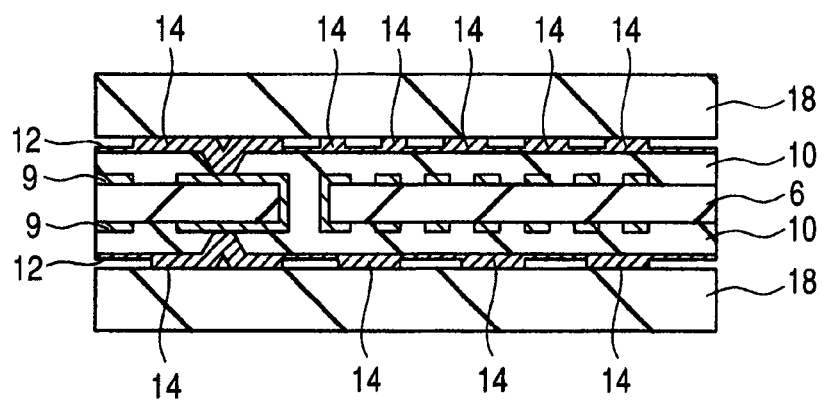
FIG. 19 is a section view of essential parts during the manufacturing process of the substrate matrix, following FIG. 18.
Figure 20:
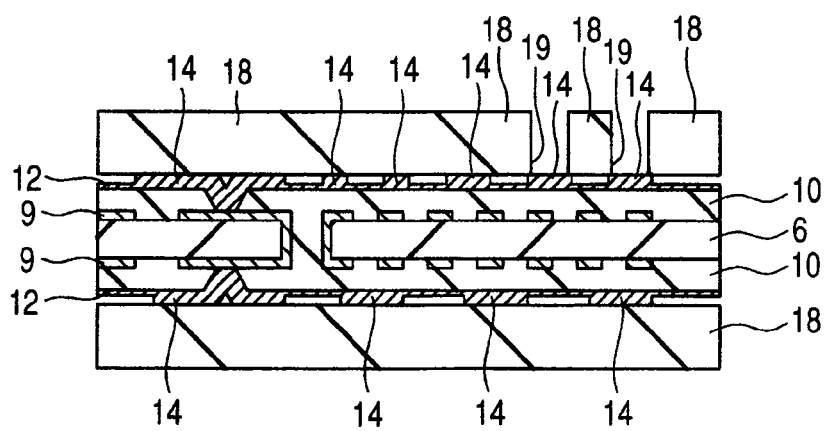
FIG. 20 is a section view of essential parts during the manufacturing process of the substrate matrix, following FIG. 19.
Figure 21:
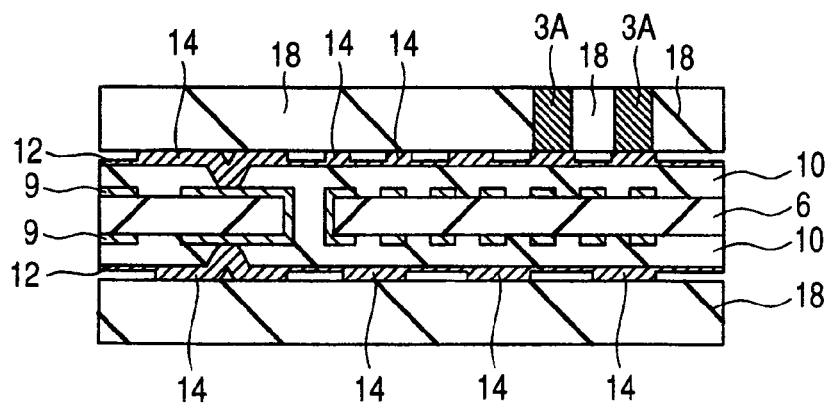
FIG. 21 is a section view of essential parts during the manufacturing process of the substrate matrix, following FIG. 20.
Figure 22:
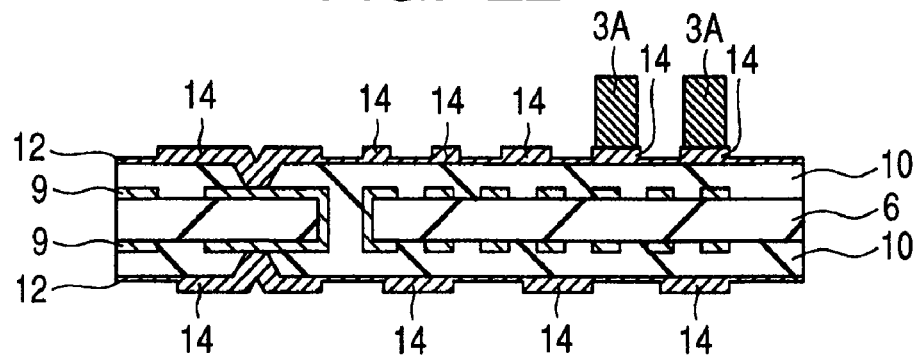
FIG. 22 is a section view of essential parts during the manufacturing process of the substrate matrix, following FIG. 21.
Figure 23:
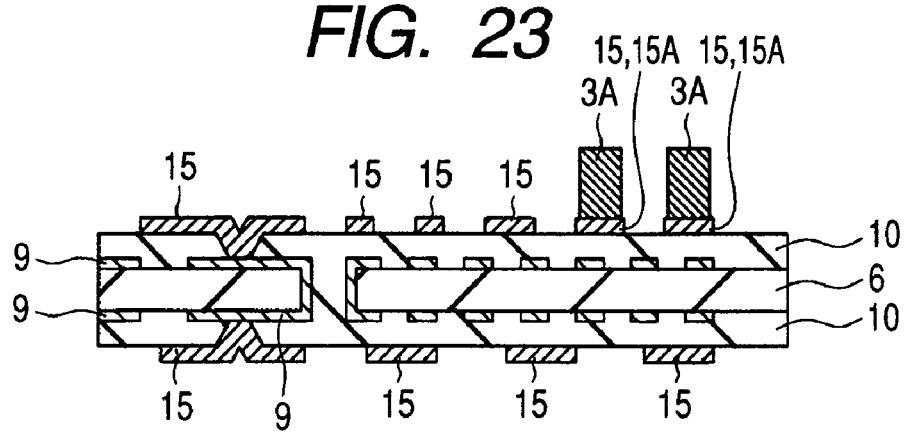
FIG. 23 is a section view of essential parts during the manufacturing process of the substrate matrix, following FIG. 22.

Next, by laser processing, an opening 11 that reaches part of the wiring 9 is formed in the insulating layer 10 of both surfaces of the core material 6 (refer to FIG. 13). Next, by the electroless plating method, a copper film 12 is formed over both surfaces of the core material 6 (refer to FIG. 14). At this time, the copper film 12 is formed also within the opening 11 and the copper film 12 and the wiring 9 are coupled at the bottom of the opening 11. Next, after pasting a photoresist film 13 including dry film onto both the main surface and the back surface of the core material 6 (refer to FIG. 15), the photoresist film 13 is patterned by the photolithography technique (refer to FIG. 16). Next, a copper film 14 is grown selectively over the copper film 12 by the electrolytic plating method using the remained photoresist film 13 as a mask and the copper film 12 as a seed layer (refer to FIG. 17). Next, after peeling off the photoresist film 13 (refer to FIG. 18), a photoresist film 18 including dry film is pasted onto both the main surface and the back surface of the core material 6 (refer to FIG. 19). Next, by the photolithography technique, the photoresist film 18 on the main surface side is patterned and an opening 19 that reaches the copper film 14 is formed selectively in the photoresist film 18 over the copper film 14 on the main surface side (refer to FIG. 20). Next, a copper film is grown selectively over the copper film 14 by the plating method using the remained photoresist film 18 as a mask and the copper film 14 under the opening 19 as a seed layer, and thus, the conductive member 3A described using FIG. 1 is formed (refer to FIG. 21).

Next, after peeling off the photoresist film 18 (refer to FIG. 22), the copper film 12 is etched by the electroless etching method and a wiring 15 is formed from the copper film 12 and the copper film 14 that remain. Here, part of the wiring 15 forms the electrode pad 15A described previously or an electrode pad 15B. By the process up to this step, it is possible to form the wiring layer in the second layer including the wiring 15 in both surfaces of the core material 6 (refer to FIG. 23). Part of the wiring 15 has a structure in which the wiring 15 is coupled to the wiring 9.

Figure 24:
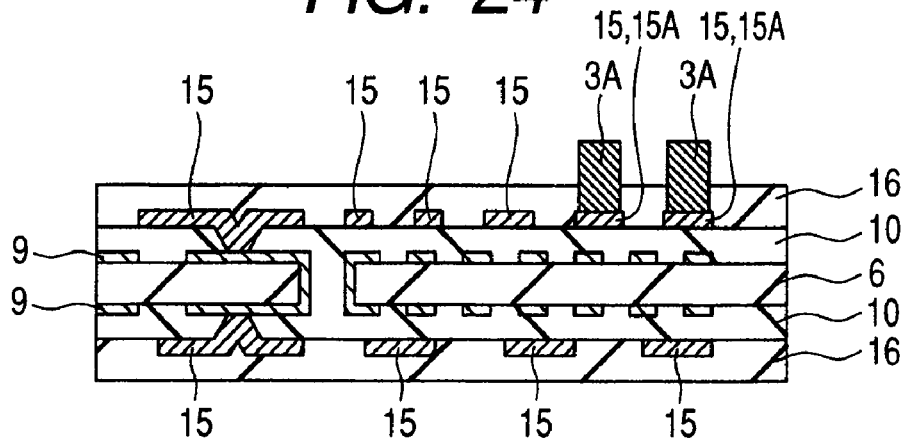
FIG. 24 is a section view of essential parts during the manufacturing process of the substrate matrix, following FIG. 23.
Figure 25:
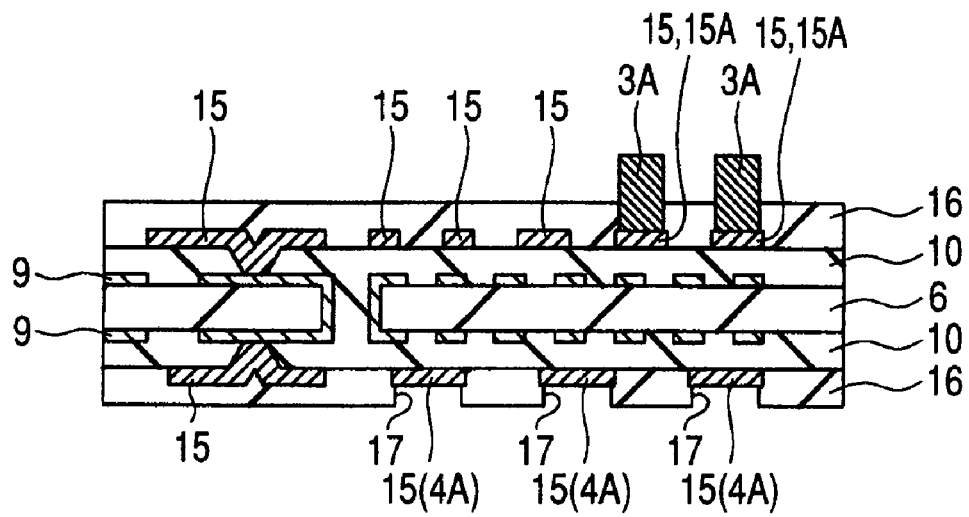
FIG. 25 is a section view of essential parts during the manufacturing process of the substrate matrix, following FIG. 24.

Next, the solder resist 16 is printed on both surfaces of the core material 6 (refer to FIG. 24). Next, the solder resist 16 is patterned by the photolithography technique and an opening 17 that reaches part of the wiring 15 is formed in the solder resist 16 (refer to FIG. 25). Here, on the main surface side of the core material 6, part of the wiring 15 that is exposed at the bottom of the opening 17 forms the electrode pad 3C used to mount the semiconductor chip of the substrate matrix 1 described previously (not shown schematically in FIG. 5). On the back surface side of the core material 6, the wiring 15 that is exposed at the bottom of the opening 17 forms the electrode pad 4A of the substrate matrix 1 described previously.

Figure 26:
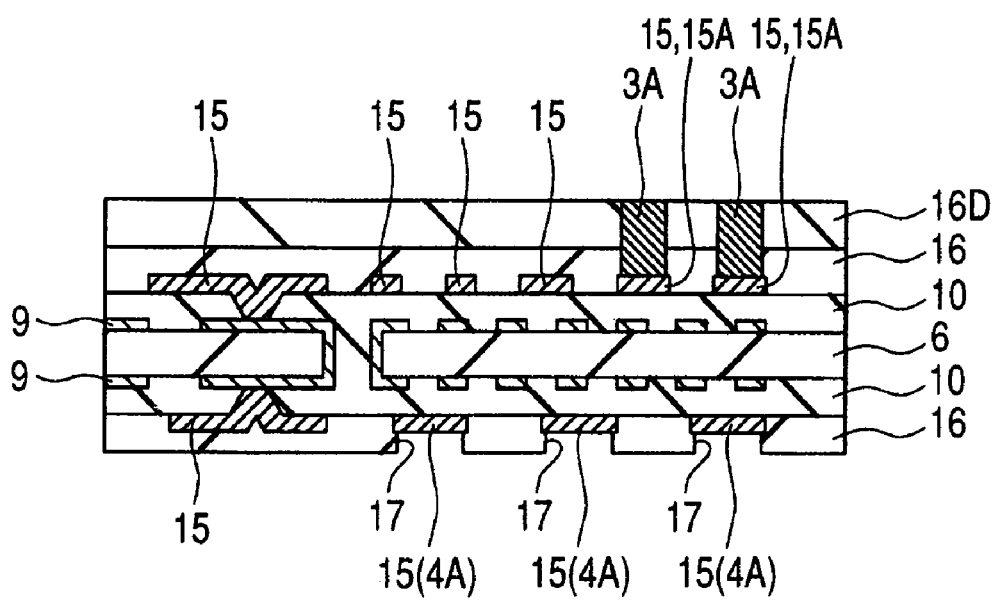
FIG. 26 is a section view of essential parts during the manufacturing process of the substrate matrix, following FIG. 25.

Next, the solder resist 16D is printed on the main surface side of the core material 6 (refer to FIG. 26). The solder resist 16D is made to have a thickness so that its surface aligns with the top part of the conductive member 3A in the form of a post. Further, the film thickness of the solder resist 16D is made to be greater than that of the semiconductor chip 22 to be mounted in the wiring substrate 1C in a subsequent step.

Next, the solder resist 16D is patterned by the lithography technique and by removing the solder resist 16D in the region in which the semiconductor chip 22 is mounted in a subsequent step, the substrate matrix 1 as shown in FIG. 32 is manufactured. The remained solder resist 16D forms a pattern that surrounds a region in which the semiconductor chip 22 is mounted in a planar view, and further, an injection path (details will be described later using FIG. 41) through which the mold resin (sealing body) 29 is injected into the region in which the semiconductor chip 22 is mounted is provided in a subsequent step. In the manner described above, the surround of the conductive member 3A in the form of a post is covered and sealed with not only by the solder resist 16 but also by the solder resist 16D except for the tip end part. Therefore, even if the height of the conductive member 3A is increased, the structure is such that the surround thereof is reinforced by the solder resists 16, 16D and it is possible to make the conductive member 3A hard to fell down.

Figure 27:
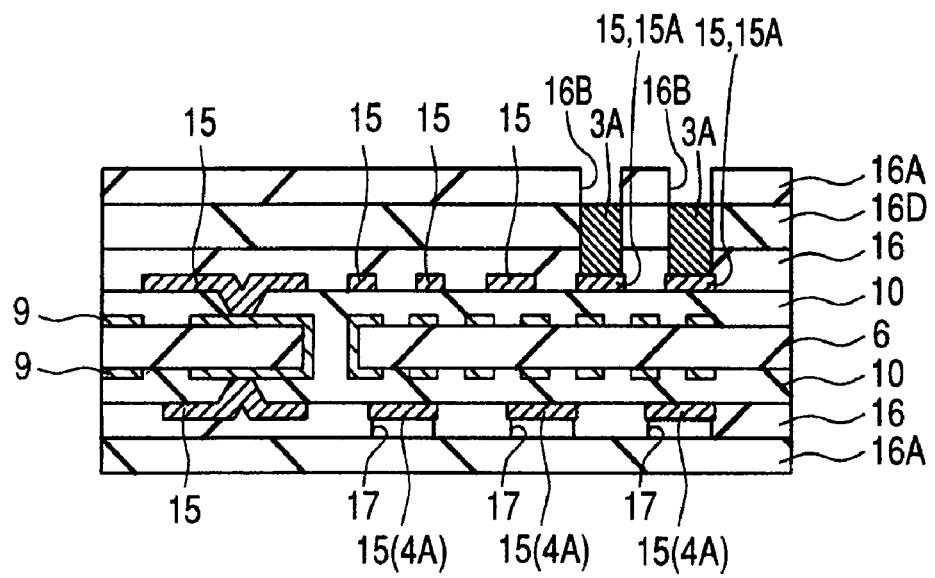
FIG. 27 is a section view of essential parts during the manufacturing process of the substrate matrix, following FIG. 26.
Figure 28:
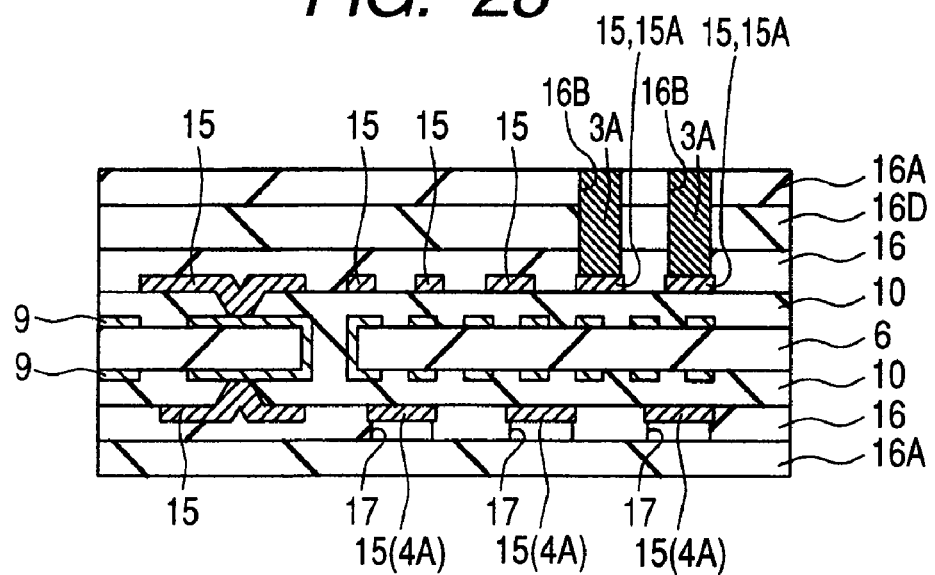
FIG. 28 is a section view of essential parts during the manufacturing process of the substrate matrix, following FIG. 27.

Next, after pasting a photoresist film 16A including dry film onto both the main surface and the back surface of the core material 6, the photoresist film 16A is patterned by the photolithography technique and an opening 16B is formed in the photoresist film 16A over the conductive member 3A (refer to FIG. 27). Next, a copper film is selectively grown in the opening 16B over the conductive member 3A by the electrolytic plating method using the remained photoresist film 16A as a mask and the conductive member 3A (copper film) as a seed layer, and thereby, the conductive member 3A is increased in height (refer to FIG. 28). Next, the photoresist film 16A is peeled off.

Next, the above-described guide holes 1A, 2A that penetrate through the core material 6 are formed by drill processing (refer to FIG. 1 and FIG. 2) and the substrate matrix 1 as shown in FIG. 29 is manufactured. At this time, the height of the projection of the conductive member 3A from the surface of the solder resist 16 is made greater than the height of the semiconductor chip 22 when mounted in the wiring substrate 1C (height from the surface of the solder resist 16 to the back surface of the semiconductor chip 22) when the semiconductor chip 22 to be mounted in the wiring substrate 1C is joined (flip chip bonding) to the wiring substrate 1C using a bump electrode. Further, the amount of projection (height of projection) from the solder resist 16D of the conductive member 3A is made less than the thickness of the wiring substrate 2C (the substrate matrix 2 to be described later).

The substrate matrix 1 is manufactured in the process described above, however, it may also be possible to further form a multilayer structure by repeating the process of forming the insulating layer 10 and the wiring 15 when manufacturing the substrate matrix 1 to be the wiring substrate 1C.

Figure 55:
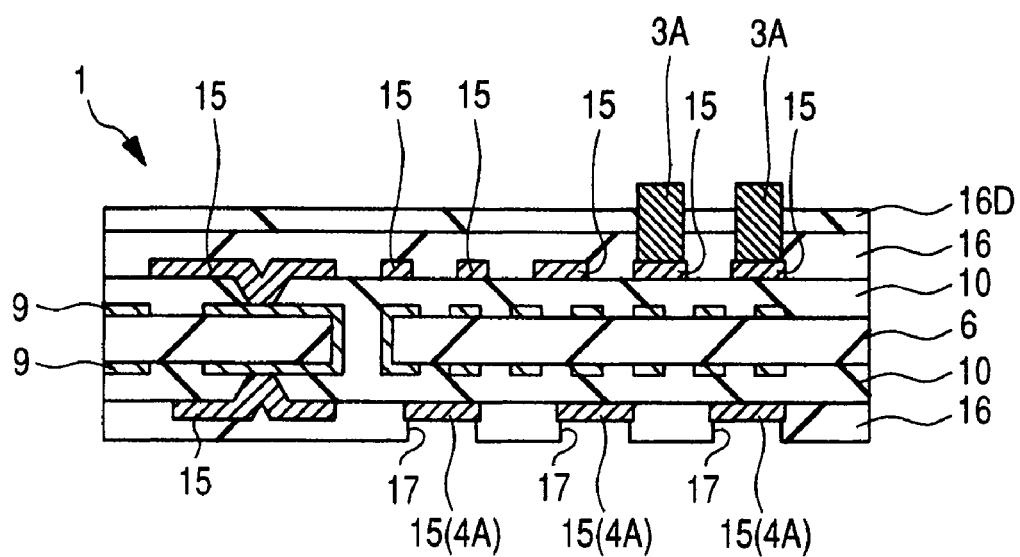
FIG. 55 is a section view of essential parts during the manufacturing process of the substrate matrix, following FIG. 26.

Further, it may also be possible to make thin the solder resist 16D by blast processing and cause the conductive member 3A to project from the surface of the solder resist 16D after the process (refer to FIG. 26) of printing the above-described solder resist 16D, patterning the solder resist 16D by the photolithography technique, and removing the solder resist 16D in the region in which the semiconductor chip 22 is mounted in a subsequent step (refer to FIG. 55). However, it is required to print the solder resist 16D thick in advance so that the thickness of the solder resist 16D after the blast processing is greater than that of the semiconductor chip 22 to be mounted in the wiring substrate 1C in a subsequent step.

Figure 30:
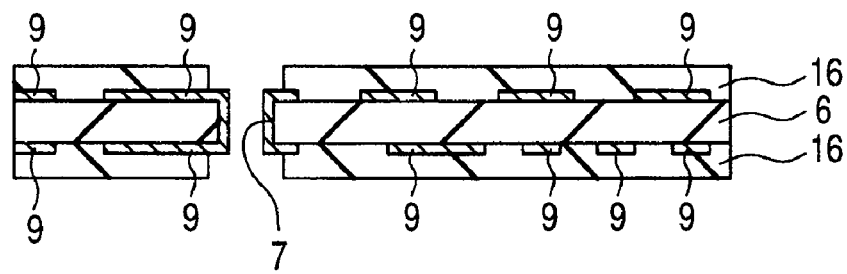
FIG. 30 is a section view of essential parts for explaining a method of manufacturing the substrate matrix shown in FIG. 3 and FIG. 4.
Figure 31:
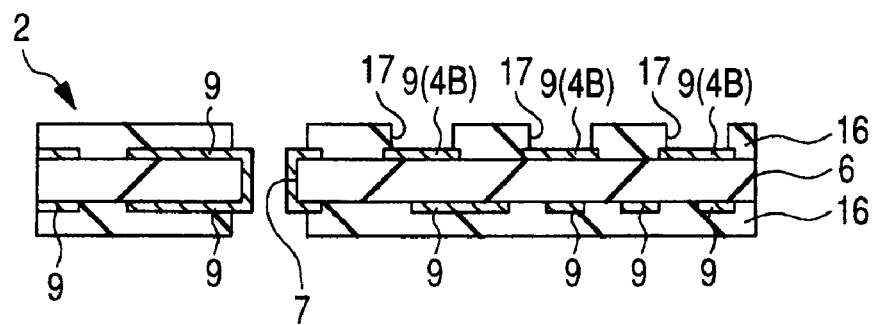
FIG. 31 is a section view of essential parts during a manufacturing process of the substrate matrix, following FIG. 30.

Next, a manufacturing process of the above-mentioned substrate matrix 2 will be described using FIG. 30 and FIG. 31. FIG. 30 and FIG. 31 each show a section view of essential parts during a manufacturing process of the substrate matrix 2.

The manufacturing process of the substrate matrix 2 is the same as that of the substrate matrix 1 described above using FIG. 5 to FIG. 10 up to the step of forming the wiring 9 (first wiring layer). After that, the solder resist 16 is printed on both surfaces of the core material 6 (refer to FIG. 30). At this time, the solder resist 16 is not printed over the through hole 7 so that the wiring 9 on the sidewall of the through hole 7 is exposed.

Next, the solder resist 16 is patterned by the photolithography technique and the opening 17 that reaches part of the wiring 9 is formed in the solder resist 16 and thus the substrate matrix 2 is manufactured (refer to FIG. 31). Here, on the main surface side of the core material 6, the wiring 9 that is exposed at the bottom of the opening 17 forms the electrode pad (land, bonding lead) 4B.

Next, a manufacturing process of the POP type semiconductor device in the present embodiment using the substrate matrixes 1, 2 manufactured through the above-mentioned steps will be described using FIG. 32 to FIG. 46.

Figure 34:
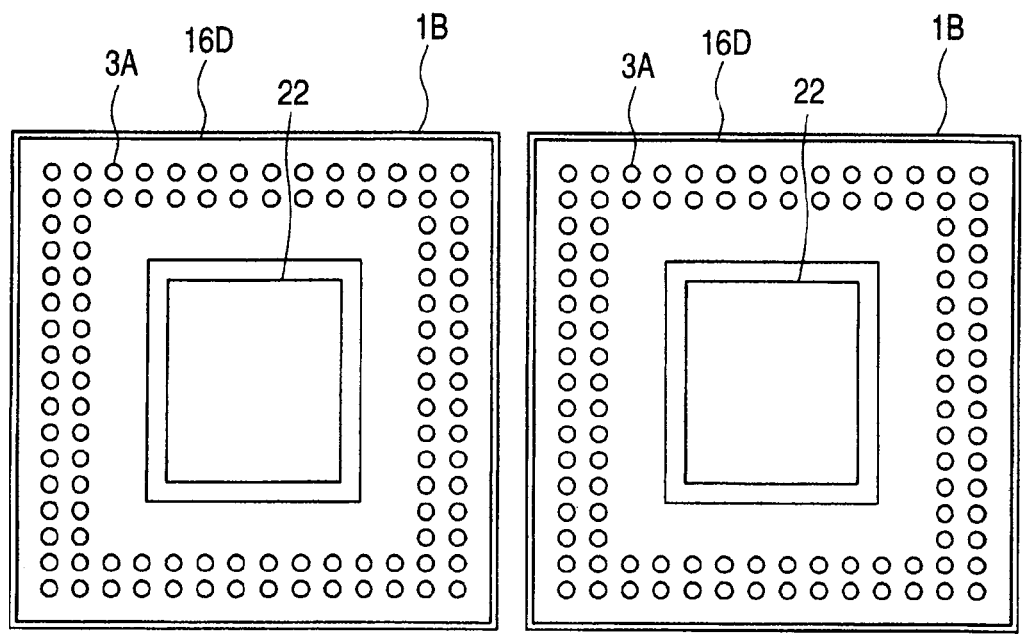
FIG. 34 is a section view of essential parts during a manufacturing process of a semiconductor device, which is an embodiment of the present invention.
Figure 35:
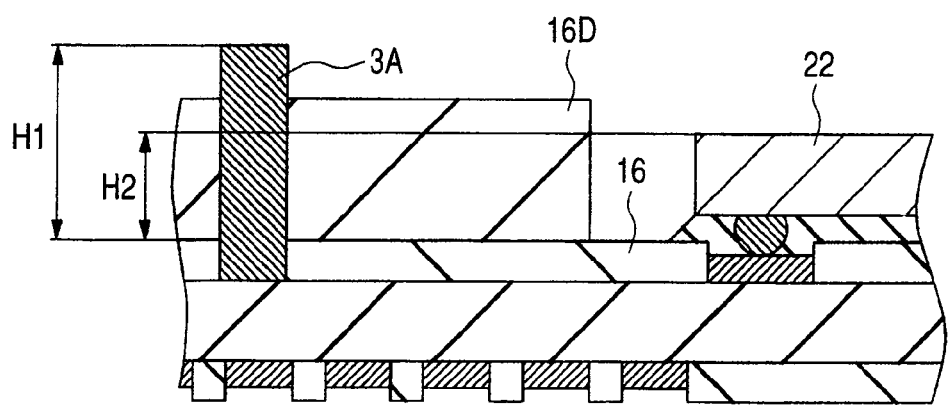
FIG. 35 is a section view of essential parts during a manufacturing process of a semiconductor device, which is an embodiment of the present invention.
Figure 36:
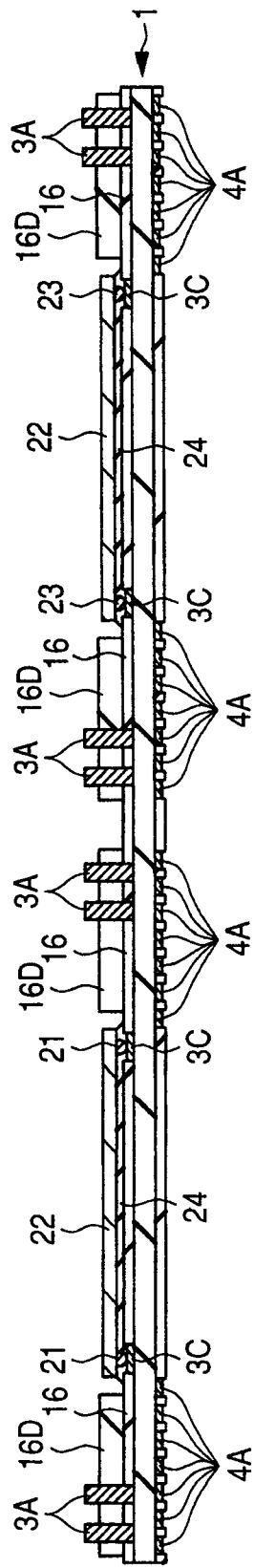
FIG. 36 is a section view of essential parts during the manufacturing process of the semiconductor device, following FIG. 33.

First, the substrate matrix 1 is prepared (refer to FIG. 32). Next, the semiconductor chip 22 is mounted in the region to be each wiring substrate 1C in the main surface of the substrate matrix 1 (refer to FIG. 33). Here, FIG. 34 is a plan view showing an enlarged view of a region 1B to be two neighboring wiring substrates 1C. In the examples shown in FIG. 33 and FIG. 34, a bump electrode (projecting electrode) 23 is formed over the bonding pad (not shown schematically) formed in the surface and the semiconductor chip 22 is mounted in the region to be each wiring substrate 1C by the bump electrode 23 being joined with the electrode pad 3C. At this time, the semiconductor chip 22 is mounted so that the surface side in which the element is formed is in opposition to the substrate matrix 1.

As described in the explanation of the process of manufacturing the substrate matrixes 1, 2, a projection height H1 of the conductive member 3A from the surface of the solder resist 16D is greater than a height (from the surface of the solder resist 16 in the region where the semiconductor chip 22 is mounted to the back surface of the semiconductor chip 22) H2 of the semiconductor chip 22 mounted in the region to be a base substrate.

Figure 37:
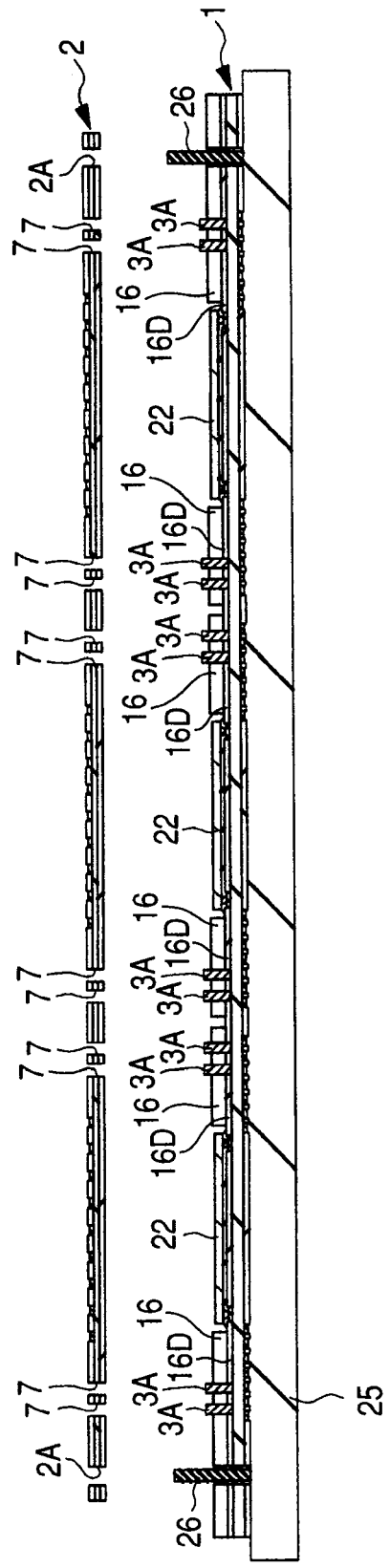
FIG. 37 is a section view of essential parts during a manufacturing process of a semiconductor device, which is an embodiment of the present invention.

Next, after applying an underfill resin 24 between the semiconductor chip 22 and the substrate matrix 1 (refer to FIG. 36), the substrate matrix 1 is mounted in a stage 25 for thermal compression bonding (refer to FIG. 37). At this time, the back surface side of the substrate matrix 1 that is mounted is in opposition to the stage 25 and the substrate matrix 1 is positioned over the stage 25 by running a guide pin 26 provided to the stage 25 through the guide hole 1A of the substrate matrix 1 (refer to FIG. 1 and FIG. 2). Next, the substrate matrix 2 is prepared (refer to FIG. 37).

Figure 38:
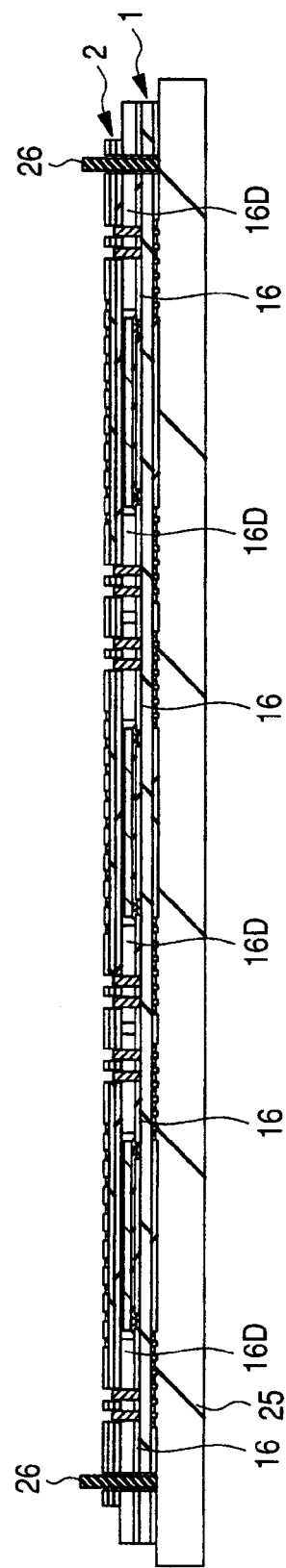
FIG. 38 is a section view of essential parts during the manufacturing process of the semiconductor device, following FIG. 37.

Next, the substrate matrix 2 is mounted in the stage 25 (refer to FIG. 38). At this time, the back surface side in which the conductive member 3B is formed of the substrate matrix 2 is made to oppose the substrate matrix 1 and the substrate matrix 2 is positioned over the stage 25 by running the guide pin 26 through the guide hole 2A of the substrate matrix 2, and thus, a state is brought about where the conductive members 3A projecting from the solder resist 16D of the substrate matrix 1 are inserted into respective corresponding through holes 7 of the substrate matrix 2. Further, as described previously, the amount of projection (height of projection) of the conductive member 3A from the solder resist 16D is made less than the thickness of the wiring substrate 2C (the substrate matrix 2 to be described later), and therefore, the tips of the conductive members 3A do not project from the main surface of the substrate matrix 2 but are located within the through hole 7 as a result. In the next step, the through hole 7 is filled with the conductive member, however, the tip of the conductive member 3A does not project from the main surface of the substrate matrix 2, and therefore, it is made possible to use the conductive member filled in the through hole 7 as the electrode pad (land) 4B for mounting a semiconductor chip or a chip part. Due to this, it is made possible to ensure a wide region for mounting a semiconductor chip or a chip part in the main surface of the wiring substrate 2C. When the position of the substrate matrixes 1, 2 is determined over the stage 25, a state is brought about where the regions to be the wiring substrates 1C defined in the substrate matrix 1 are in opposition to the respective regions to be the wiring substrates 2C defined in the substrate matrix 2 in a one-to-one manner. When the substrate matrix 2 is mounted in the stage 25, a state is brought about where the surface of the solder resist 16D that covers the surround of the conductive member 3A in the form of a post of the substrate matrix 1 is in contact with the back surface of the substrate matrix 2.

Next, the through hole 7 of the substrate matrix 2 is filled with the conductive member 3B (refer to FIG. 39). In the present embodiment, it is possible to illustrate the use of a conductive paste, such as solder (including lead-free solder) and silver (Ag), copper (Cu) and an alloy thereof (Ag—Cu), as the conductive member 3B. In FIG. 39, an enlarged section of a part in the vicinity of the through hole 7 of the substrate matrix 2 is also shown. As described previously, by filling the through hole 7 with the conductive member 3B, it is possible to form the electrode pad 4B at a position where the electrode pad 4B overlaps the conductive member 3A formed in the wiring substrate 1C, that is a base substrate, in a planar view. That is, it is made possible to use the top part of the conductive member 3A also as an electrode pad, and therefore, the versatility of the semiconductor member that can be mounted in the wiring substrate 2C can be extended.

Figure 40:
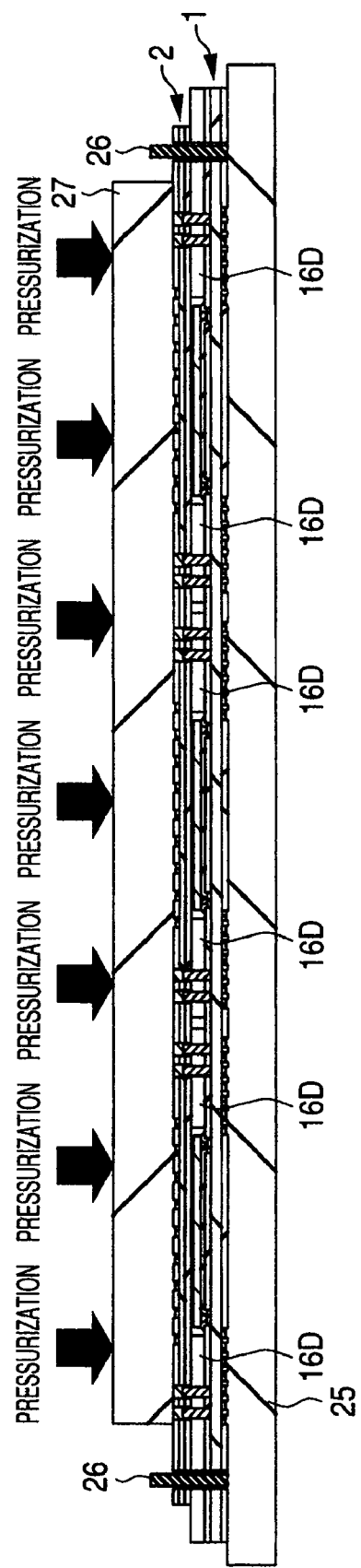
FIG. 40 is a section view of essential parts during the manufacturing process of the semiconductor device, following FIG. 39.

Next, the substrate matrix 2 is heated and pressurized from its back surface side using a heating tool 27, thereby, the conductive member 3A and the conductive member 3B are subjected to thermal compression-bonding (joined) and electrically coupled to each other (refer to FIG. 40).

Figure 41:
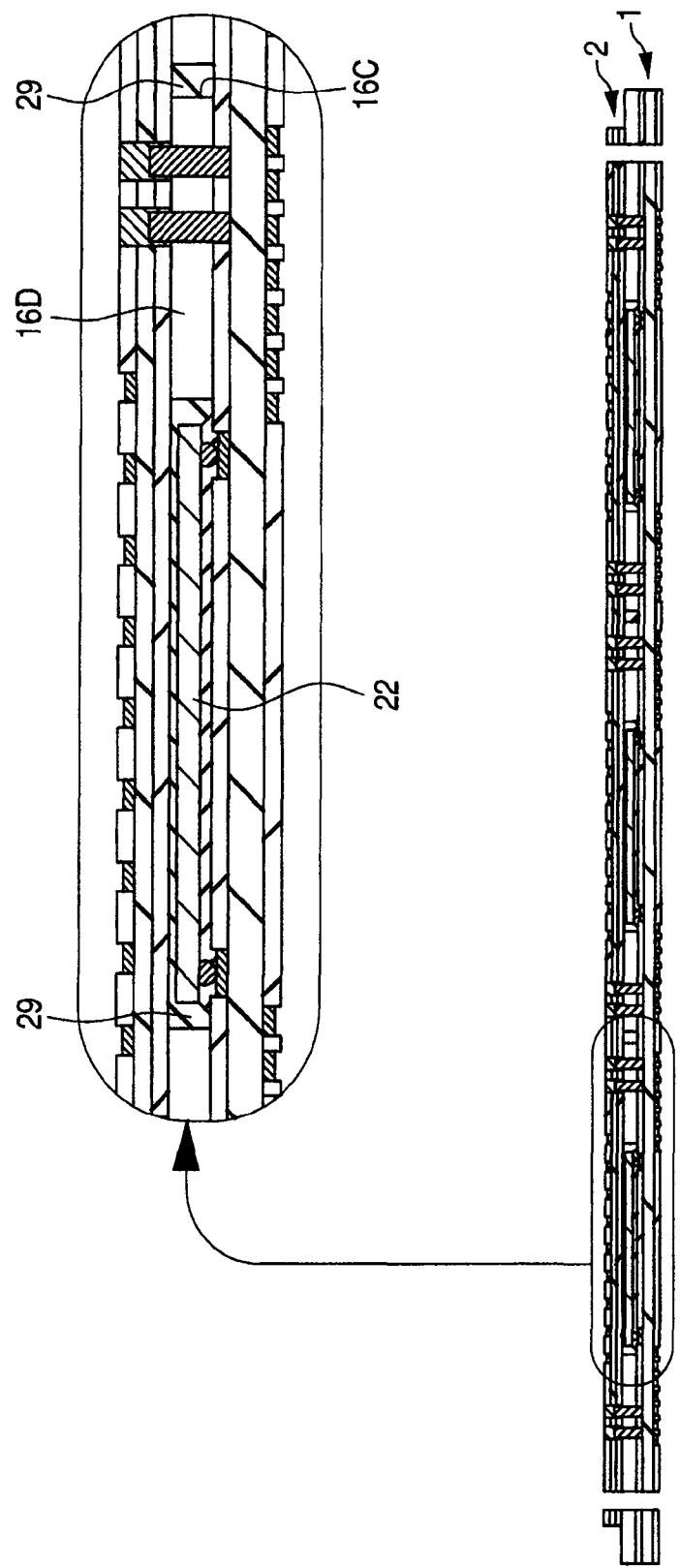
FIG. 41 is a section view of essential parts during the manufacturing process of the semiconductor device, following FIG. 40.

Next, the mold resin 29 is injected between the substrate matrix 1 and the substrate matrix 2 and a sealing body is formed, which seals with resin between the substrate matrix 1 and the substrate matrix 2 (refer to FIG. 41). In FIG. 41, an enlarged section of a part in the vicinity of one semiconductor chip 22 is also shown. The mold resin 29 is injected into and filled in the region in which the semiconductor chip 22 is mounted through an injection path 16C provided in the solder resist 16D described previously. As explained previously, part of the mold resin 29 is formed also between the semiconductor chip 22 and the substrate matrix 2 (wiring substrate 2C), and therefore, it is made possible to suppress the problem of distortion of the substrate matrix 2 (wiring substrate 2C) due to the load when the semiconductor chip 32 is mounted in a subsequent step (details will be described later using FIG. 45 and FIG. 46) even if the thickness of the substrate matrix 2 (wiring substrate 2C) is reduced. Further, as described previously, the solder resist 16D that covers the surround of the conductive member 3A is in contact with the back surface of the substrate matrix 2 (wiring substrate 2C), and therefore, the configuration is such that the mold resin 29 in contact with the back surface of the substrate base 2 (wiring substrate 2C) supports the substrate matrix 2 (wiring substrate 2C) even if the mold resin 29 is not formed between the semiconductor chip 22 and the substrate matrix 2 (wiring substrate 2C). With this configuration, it is also possible to make the substrate matrix 2 (wiring substrate 2C) hard to deflect.

Next, the resin-sealed substrate matrixes 1, 2 are taken out from the mold die and the mold resin 29 that bulges out is removed and molded.

Figure 42:
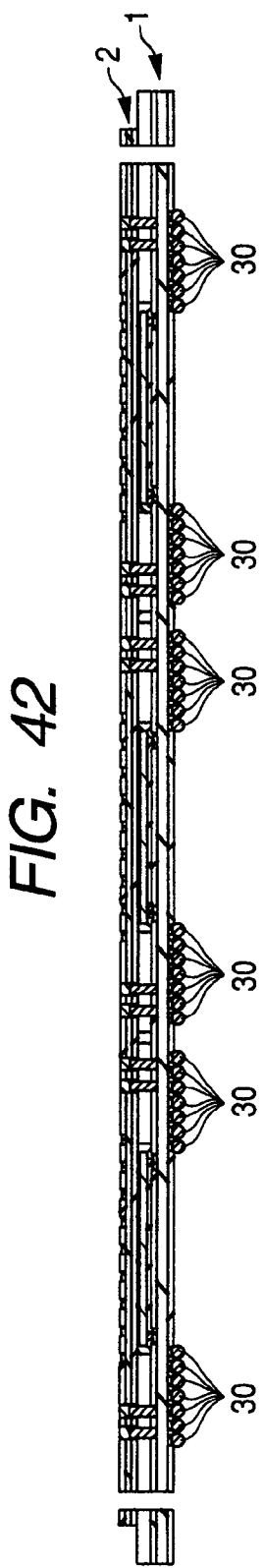
FIG. 42 is a section view of essential parts during the manufacturing process of the semiconductor device, following FIG. 41.

Next, solder balls are arranged over respective electrode pads 4A of the substrate matrix 1, the solder ball is joined with the electrode pad 4A by performing reflow processing, and thus the bump electrode (external terminal) 30 is formed (refer to FIG. 42).

Figure 44:
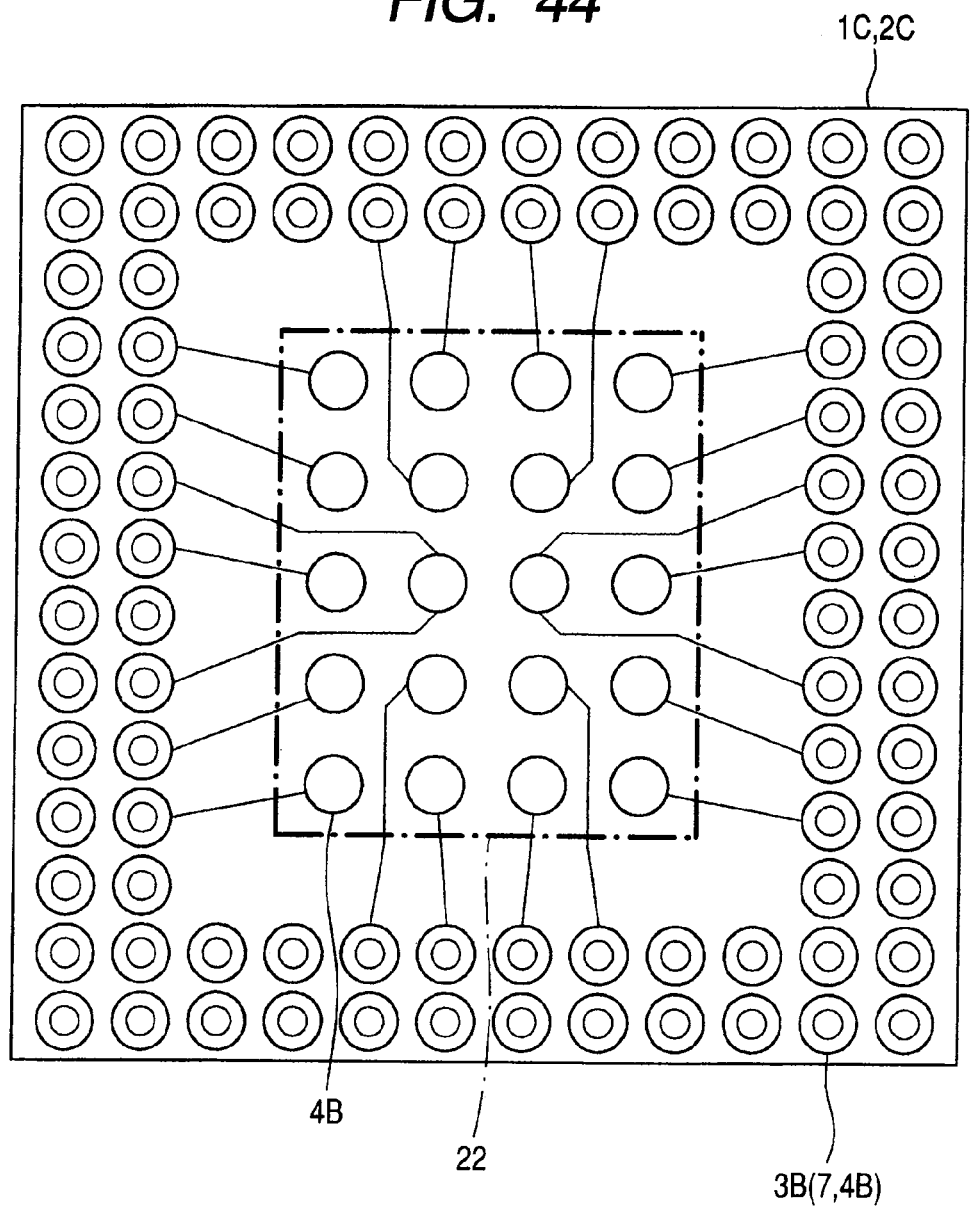
FIG. 44 is a plan view during a manufacturing process of a semiconductor device, which is an embodiment of the present invention.

Next, along the planar outer shape of the region to be the wiring substrate 1C and the region to be the wiring substrate 2C, the substrate matrixes 1, 2 are cut into individual pieces and sets of each individual wiring substrate 1C and wiring substrate 2C (refer to FIG. 43). Here, FIG. 44 is a plan view after the substrate matrixes 1, 2 are cut into individual pieces and sets of each individual wiring substrate 1C and wiring substrate 2C. As shown in FIG. 44, in the present embodiment, the substrate matrixes 1, 2 are cut altogether, and therefore, the dimensions of the planar outer shape of the wiring substrate 1C are the same as those of the wiring substrate 2C. Further, in the present embodiment, the electrode pad 4B that is electrically coupled to the conductive member 3B is disposed also at a position where the electrode pad 4B overlaps the semiconductor chip 22 in a planar view. That is, in the wiring substrate 2C, it is made possible to mount a chip, chip part, etc., also at a position where it overlaps the semiconductor chip 22 in the lower tier in a planar view. Due to this, it is made possible to increase the number of the electrode pads 4B (including the electrode pads 4B formed by filling the through hole 7 with the conductive member 3B) to be disposed in the wiring substrate 2C without increasing the outer size of the wiring substrate 1C and the wiring substrate 2C. Further, with the same number of the electrode pads 4B, it is possible to reduce the outer size of the wiring substrate 1C and the wiring substrate 2C, and therefore, it is also made possible to downsize the semiconductor device (semiconductor system) SDS in the present embodiment.

Next, the semiconductor member 32 is prepared, in which a bump electrode 31 is formed as an electrode for external connection. Next, by coupling the bump electrode 31 to the electrode pad 4B of the wiring substrate 2C, the semiconductor member 32 is mounted in and electrically coupled to the wiring substrate 2C, and thus, the semiconductor device (semiconductor system) SDS in the present embodiment is manufactured. FIG. 46 is a plan view when the semiconductor member 32 is mounted in the wiring substrate 2C. According to the present embodiment, it is also possible to dispose the semiconductor member 32 in the upper tier also in a region where the semiconductor member 32 overlaps the semiconductor chip 22 in the lower tier in a planar view. FIG. 46 shows a case where the planar outer shape of the semiconductor member 32 is substantially the same as that of the wiring substrate 1C and the wiring substrate 2C, however, the planar outer shape of the semiconductor member 32 may be smaller.

Figure 47:
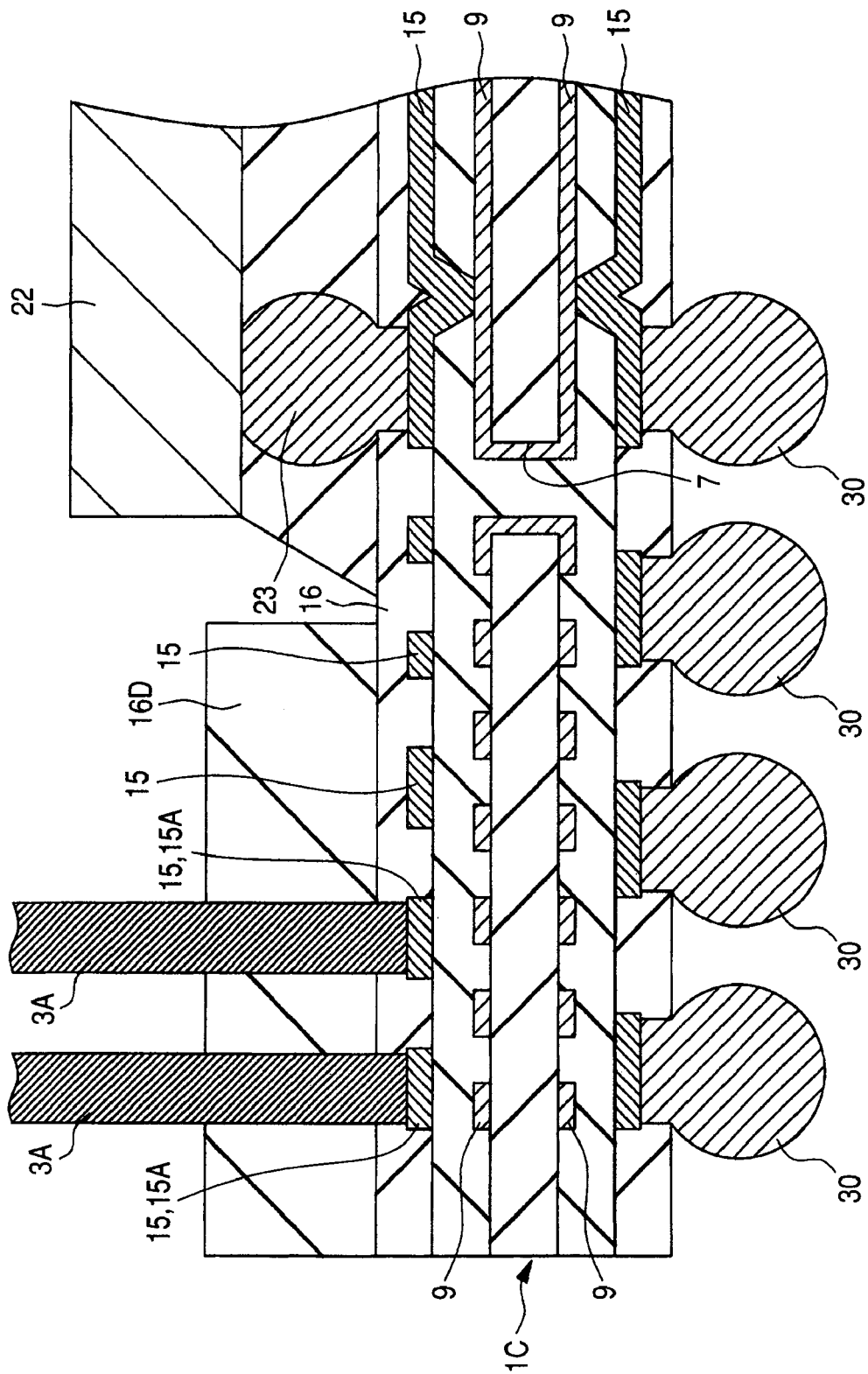
FIG. 47 is a section view of essential parts of a semiconductor device, which is an embodiment of the present invention.

FIG. 47 is a section view of essential parts of the POP type semiconductor device of the present embodiment and FIG. 48 is an example of a system block diagram when the POP type semiconductor device of the present embodiment is mounted in an external mounting substrate, such as a motherboard.

It is possible to illustrate that the semiconductor chip 22 mounted in the wiring substrate 1C in the lower layer is an SOC (System On Chip) type chip and used to perform logic processing, such as image processing, and that the semiconductor member 32 mounted in the wiring substrate 2C in the upper layer is a memory chip and used as a work RAM at the time of logic processing performed by the semiconductor chip 22 in the lower tier. Between the semiconductor chip 22 and the semiconductor member 32, signals are transmitted and received via the bump electrode 23, the wirings 9, 15, and the conductive members 3A, 3B. Between the semiconductor chip 22 and the external LSI 33, signals are transmitted and received via the bump electrode 23, the wirings 9, 15, and the bump electrode 30. The power supply potential (VDD) and the reference potential (GND) are supplied to the semiconductor chip 22 via the bump electrode 30 and the wirings 9, 15, and the power supply potential (VDD) and the reference, potential (GND) are supplied to the semiconductor member 32 via the bump electrode 30, the conductive members 3A, 3B, the electrode pad 4B, and the wirings 9, 15 but not via the semiconductor chip 22.

Figure 49:
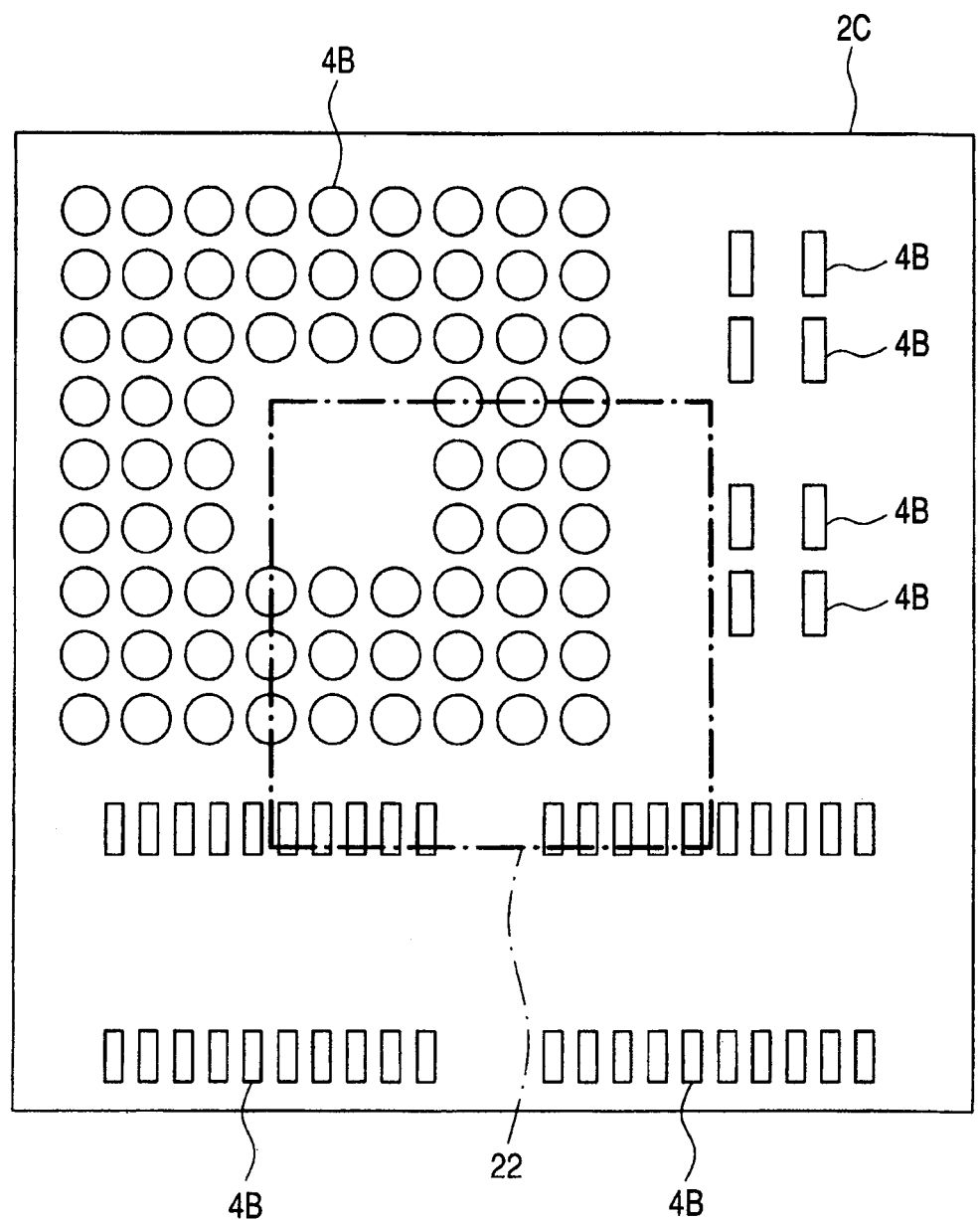
FIG. 49 is a plan view of essential parts of a semiconductor device, which is an embodiment of the present invention.
Figure 50:
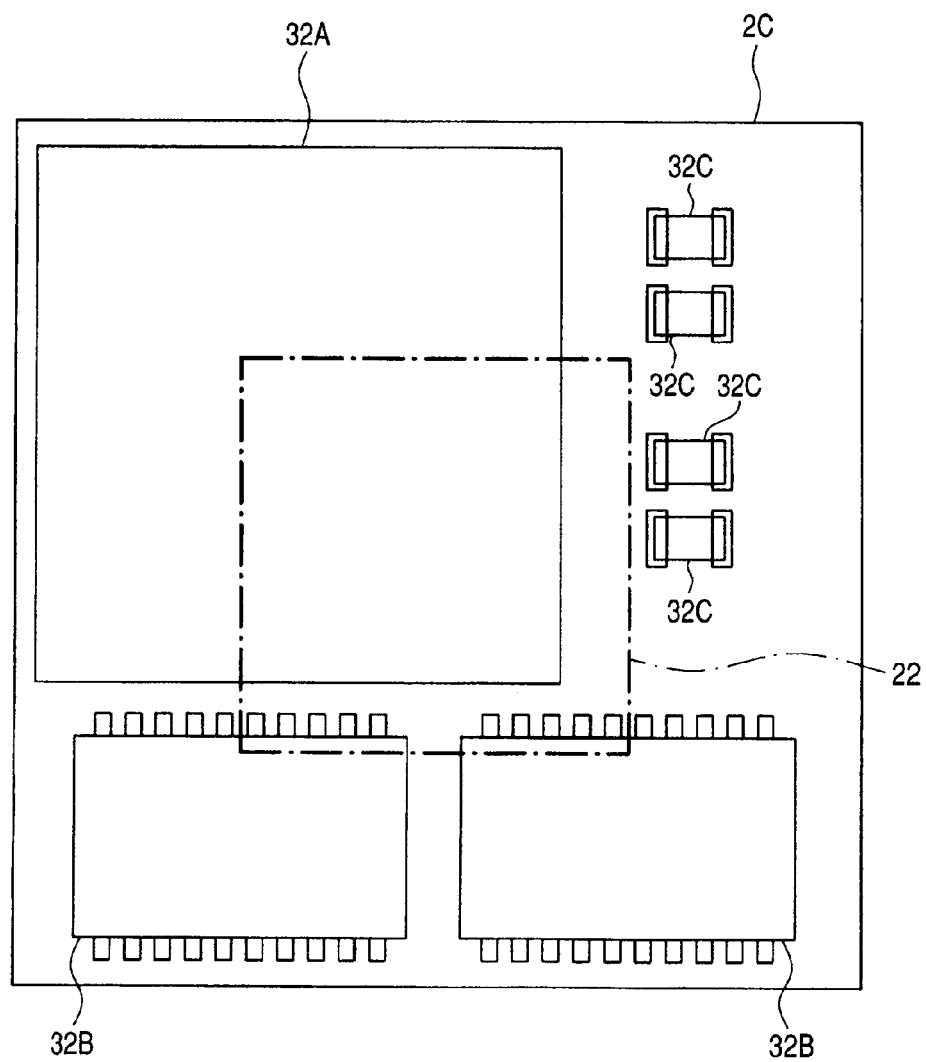
FIG. 50 is a plan view of essential parts of a semiconductor device, which is an embodiment of the present invention.

It is also possible to mount a plurality of semiconductor chips (microcomputer chip, memory chip, etc.), chip parts (resistor, capacitor, inductor, etc.), etc., in the wiring substrate 2C. FIG. 49 is a plan view of the wiring substrate 2C in which the semiconductor chips and chip parts can be mounted. The electrode pad 4B provided in the wiring substrate 2C is formed into a planar shape in accordance with that of the semiconductor chip and the chip part to be mounted. In such a case also, it is possible to dispose the electrode pad 4B at a position where the electrode pad 4B overlaps the semiconductor chip 22 in the lower tier. Each electrode pad 4B formed in the top surface of the wiring substrate 2C is brought into conduction with the conductive member 3B to be filled in the through hole 7 formed in the wiring substrate 2C via a wirings (not shown schematically) formed in the top surface, the undersurface, or both the surfaces of the wiring substrate 2C. Further, when the wiring substrate 2C has a wiring layer including, for example, three or more layers, it is possible to easily bring the wiring substrate 2C into conduction with the semiconductor members 32 by using the wiring formed in the wiring layer in a further inner layer. FIG. 50 is a plan view when semiconductor chips 32A, 32B and a chip part 32C are mounted in the wiring substrate 2C. According to the present embodiment, it is possible to arrange the semiconductor chips 32A, 32B and the chip part 32C in the upper tier even in the region where the chips and chip part overlap the semiconductor chip 22 in the lower tier in a planar view. That is, according to the present embodiment, it is made possible to increase the number of combinations of the semiconductor chips 22, 32A, 32B, the semiconductor member 32, and the chip part 32C in the upper layer and the lower layer.

Figure 51:
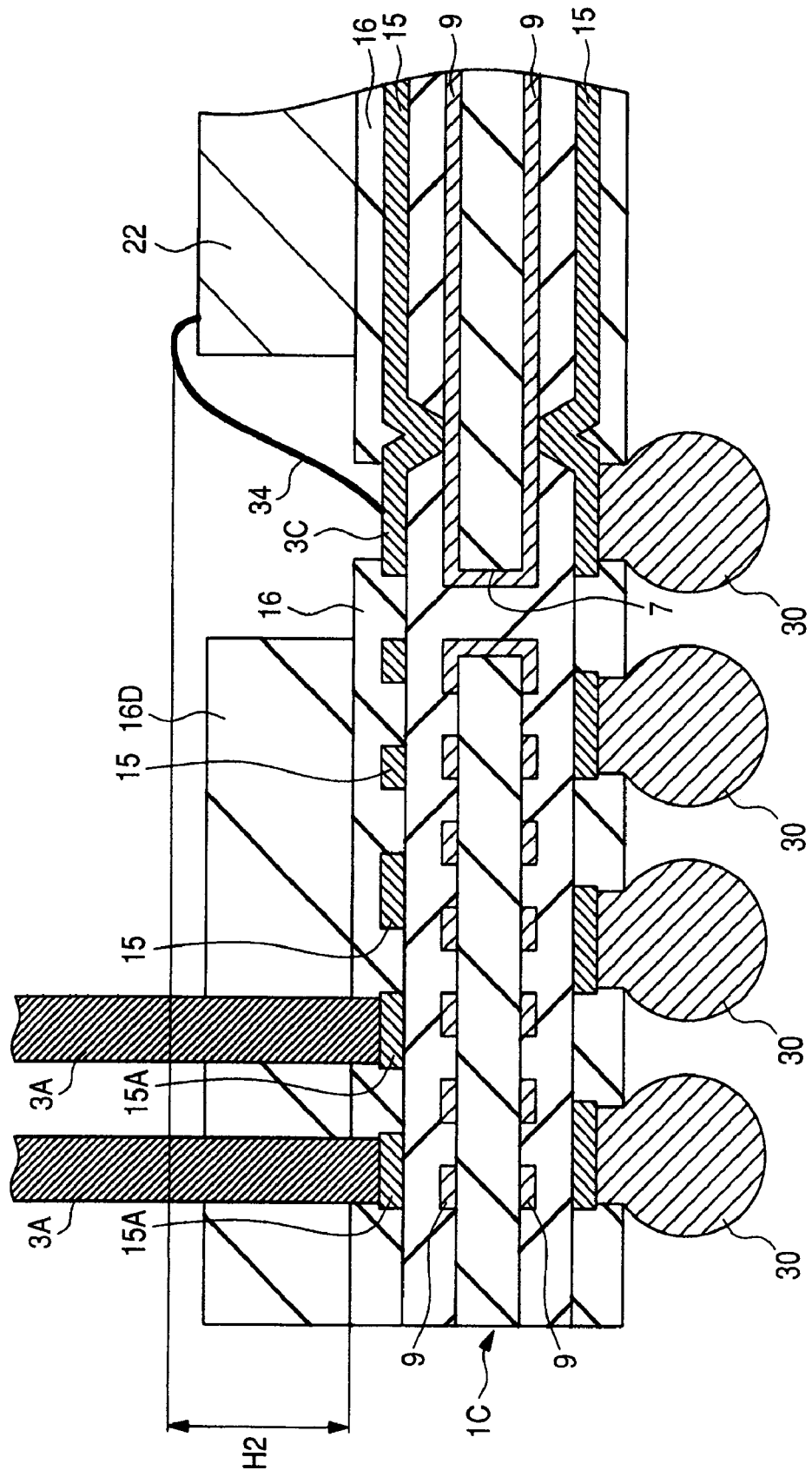
FIG. 51 is a section view of essential parts of a semiconductor device, which is an embodiment of the present invention.

In the present embodiment described above, the case is described, where the semiconductor chip 22 to be mounted in the wiring substrate 1C is mounted via the bump electrode 23, however, such a structure may be accepted, where the semiconductor chip 22 is mounted via a bonding wire 34. In this case, the semiconductor chip 22 is mounted in the wiring substrate 1C so that the back surface faces the main surface of the wiring substrate 1C. In the embodiment described above, the electrode pad 3C of the wiring substrate (base substrate) 1C to be electrically coupled to the bump electrode 23 formed over the electrode pad (not shown schematically) of the semiconductor chip 22 is formed in the region where the electrode pad 3C overlaps the semiconductor chip 22 in a planar view in the main surface of the wiring substrate (base substrate) 1C, however, as shown in FIG. 51, the electrode pad 3C is formed around the region where the semiconductor chip 22 is mounted in the wiring substrate (base substrate) 1C. When such a bonding wire 34 is used, it is preferable to form the conductive member 3A in the form of a post so as to extend higher than the thickness (height from the surface of the solder resist 16 to the highest position of the bonding wire 34) of the semiconductor chip 22 because the loop of the bonding wire 34 is formed over the semiconductor chip 22.

According to the present embodiment described above, the structure is such that the mold resin 29 is arranged between the semiconductor chip 22 (back surface when mounted via the bump electrode 23, or the main surface when mounted via the bonding wire 34) mounted in the wiring substrate 1C and the wiring substrate 2C (refer to FIG. 45). Due to this, it is possible to suppress the wiring substrate 2C from deflecting at the time of mounting the POP type semiconductor device of the present embodiment. That is, it is possible to enhance yield and reliability of the semiconductor device of the present embodiment.

Further, according to the present embodiment described above, the substrate matrixes 1, 2 are aligned in position using the guide holes 1A, 2A provided in advance in the substrate matrixes 1, 2 and then the conductive members 3A formed on the substrate matrix 1 side are inserted into the corresponding through holes 7 on the substrate matrix 2 side, respectively (refer to FIG. 38), and therefore, it is possible to easily align the position of the conductive member 3A with that of the corresponding through hole 7. Furthermore, in the circumstances where the position of the conductive member 3A is aligned with that of the corresponding through hole 7, the through hole 7 is filled with the conductive member 3B and the conductive member 3A and the conductive member 3B are joined by thermal compression bonding, and therefore, it is possible to electrically couple (join) the wiring substrate 1C (substrate matrix 1) and the wiring substrate 2C (substrate matrix 2) with ease.

The invention made by the inventors of the present invention is described specifically based on the embodiment, however, the present invention is not limited to the embodiment described above and it is needless to say that there can be various modifications within the scope not departing from the gist.

For example, in the embodiment described above, the case is described, where the conductive member in the form of a post is also formed during the manufacturing process of the substrate matrix 1, however, it may also be possible to form the conductive member in the form of a post for the manufactured substrate matrix 1 after manufacturing the substrate matrix 1.

Further, in the embodiment described above, the case is described, where the conductive member 3A in the form of a post is formed in the wiring substrate 1C located in the lower tier and which will form the base, and the through hole 7 is formed in the auxiliary wiring substrate 2C to be disposed over the wiring substrate 1C is formed, however, the configuration may be such that the through hole 7 is formed in the wiring substrate 1C to be the base, the conductive member 3A in the form of a post is formed in the auxiliary wiring substrate 2C, and these are coupled. However, as described above, in the wiring substrate 1C in the lower tier to be the base, the external terminal (bump electrode) 30 through which signals are input from and output to the external equipment is formed and the external terminal and the electrode pad formed in the top surface of the wiring substrate 1C are electrically coupled via the wiring (not shown schematically) formed in the wiring substrate 1C. Because of this, when the wiring layout is taken into consideration, if the through hole 7 is formed in the wiring substrate 1C in the lower tier to be the base, the wiring layout is restricted, or it is required to increase the outer size of the wiring substrate, and therefore, it is preferable to form the through hole 7 in the sub substrate 2C as in the embodiment described above.

Furthermore, in the embodiment described above, the process up to the step of mounting the semiconductor member 32 over the wiring substrate (sub substrate) 2C is described, and the state where the semiconductor member 32 is mounted is described as the semiconductor device, however, it may also be possible to regard a structure as shown in FIG. 43, which is obtained by forming the bump electrode 30 in the undersurface of the wiring substrate (base substrate) 1C and cutting the wiring substrates 1C, 2C and the sealing body 29, as a single finished semiconductor device. In this case, the semiconductor device is managed or shipped in the state where the semiconductor member 32 is not mounted, and therefore, it is possible to appropriately change the semiconductor system constructed in accordance with the functions of the electronic device to be applied.

The method of manufacturing a semiconductor device and the semiconductor device of the present invention can be appropriately applied to the MCM type semiconductor device and the manufacturing process of the same.

What is claimed is:

1. A method of manufacturing a semiconductor device, comprising the steps of:
   (a) providing a first substrate having a first main surface, a first electrode pad formed over the first main surface, and a first back surface on the opposite side of the first main surface; and
   (b) disposing a second substrate having a second main surface, a second electrode pad formed over the second main surface, and a second back surface on the opposite side of the second main surface over the first substrate such that the second back surface of the second substrate faces to the first main surface of the first substrate,
   wherein in the (b) step, a first conductive member, which is formed over one of the first substrate and the second substrate and which has a height greater than the thickness of a semiconductor chip disposed between the first substrate and the second substrate, is disposed within a through hole formed in the other of the first substrate and the second substrate, and the first conductive member is electrically coupled to a through-hole wiring formed within the through hole and electrically coupled to the first electrode pad or the second electrode pad.

2. A method of manufacturing a semiconductor device, comprising the steps of:
   (a) providing a first substrate having a first main surface, a first electrode pad formed over the first main surface, a second electrode pad disposed closer to the peripheral part side of the first main surface than the first electrode pad, a first conductive member formed over the second electrode pad, a first back surface on the opposite side of the first main surface, and a third electrode pad formed on the first back surface;
   (b) mounting a semiconductor chip having a front surface, a bonding pad formed over the front surface, and a back surface on the opposite side of the front surface over the first main surface of the first substrate;
   (c) electrically coupling the bonding pad of the semiconductor chip and the first electrode pad of the first substrate via a second conductive member;
   (d) disposing a second substrate having a second main surface, a fourth electrode pad formed over the second main surface, a second back surface on the opposite side of the second main surface, a through hole formed from the second main surface toward the second back surface, and a through-hole wiring formed within the through hole over the first substrate such that the first conductive member is located within the through hole and the second back surface of the second substrate faces to the first main surface of the first substrate, and electrically coupling the first conductive member and the through-hole wiring; and
   (e) after the (d) step, forming an external terminal at the third electrode pad of the first substrate,
   wherein the height of the first conductive member is greater than the thickness of the semiconductor chip.

3. The method of manufacturing a semiconductor device according to claim 2, wherein
   after the (d) step, the first conductive member does not project from the second main surface of the second substrate.

4. The method of manufacturing a semiconductor device according to claim 3, wherein:
   part of the first conductive member from the first main surface of the first substrate is covered with an insulating film; and wherein
   the amount of projection of the first conductive member from the insulating film is equal to or less than the thickness of the second substrate.

5. The method of manufacturing a semiconductor device according to claim 3, wherein
   after the (d) step, the tip surface of the first conductive member is located between the second main surface and the second back surface of the second substrate.

6. The method of manufacturing a semiconductor device according to claim 2, wherein:
   part of the first conductive member from the first main surface of the first substrate is covered with an insulating film; and wherein
   the thickness of the insulating film is greater than the height of the semiconductor chip mounted over the first main surface of the first substrate.

7. The method of manufacturing a semiconductor device according to claim 2, wherein
   part of the first conductive member from the first main surface of the first substrate is covered with an insulating film, and the insulating film is formed so as to surround the first main surface of the first substrate in a plane, and wherein
   the method further comprises the step of, after the (d) step, (f) supplying a resin between the first substrate and the second substrate to fill the gap between the first substrate and the second substrate with the resin.

8. The method of manufacturing a semiconductor device according to claim 7, wherein
   a path for injecting the resin therethrough is formed in the insulating film.

9. The method of manufacturing a semiconductor device according to claim 2, further comprising the step of (f) supplying a rein between the back surface of the semiconductor chip and the second back surface of the second substrate to fill the gap between the back surface of the semiconductor chip and the second back surface of the second substrate with the resin.

10. The method of manufacturing a semiconductor device according to claim 2, wherein
    part of the first conductive member from the first main surface of the first substrate is covered with an insulating film, and wherein
    the first conductive member is formed by a process including the steps of:
    (a1) forming a masking layer over the first main surface of the first substrate to pattern the masking layer;
    (a2) depositing the first conductive member over the second electrode pad by a plating method using the patterned masking layer as a mask; and
    (a3) removing the masking layer to cover part of the first conductive member from the first main surface of the first substrate with the insulating film.

11. The method of manufacturing a semiconductor device according to claim 2: wherein
    the first electrode pad, the second electrode pad, the third electrode pad, and a first wiring layer electrically coupled to the first conductive member are formed in the first substrate; wherein
    the second electrode pad and a second wiring layer electrically coupled to the through-hole wiring are formed in the second substrate; and wherein
    the number of the first wiring layers is greater than that of the second wiring layers.

12. The method of manufacturing a semiconductor device according to claim 2, wherein the planar outer shape of the first substrate is greater than that of the second substrate.

13. The method of manufacturing a semiconductor device according to claim 2, wherein the fourth electrode pad over the second main surface of the second substrate is formed in a region where the fourth electrode pad overlaps the semiconductor chip mounted over the first substrate in a planar view.

14. The method of manufacturing a semiconductor device according to claim 2, further including the step of (g) mounting at least one of a semiconductor chip which is the same type of or different type from the semiconductor chip, and a chip part in the number of one or more, over the second main surface of the second substrate.

* * * * *